(12) United States Patent
Takabayashi et al.

(10) Patent No.: US 7,539,378 B2
(45) Date of Patent: May 26, 2009

(54) OPTICAL WAVEGUIDE DEVICE AND SEMICONDUCTOR DEVICE

(75) Inventors: Kazumasa Takabayashi, Kawasaki (JP); Ken Morito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/826,592

(22) Filed: Jul. 17, 2007

(65) Prior Publication Data
US 2007/0258681 A1 Nov. 8, 2007

Related U.S. Application Data

(63) Continuation of application No. PCT/JP2005/000699, filed on Jan. 20, 2005.

(51) Int. Cl.
*G02B 6/42* (2006.01)
*G02B 6/26* (2006.01)

(52) U.S. Cl. .......................... 385/40; 385/39
(58) Field of Classification Search ............. 385/39–40
See application file for complete search history.

(56) References Cited

U.S. PATENT DOCUMENTS

| | | | | | |
|---|---|---|---|---|---|
| 4,689,797 | A | * | 8/1987 | Olshansky | 372/45.01 |
| 5,770,466 | A | * | 6/1998 | Sasaki et al. | 438/31 |
| 5,917,972 | A | * | 6/1999 | Davies | 385/43 |
| 6,148,132 | A | * | 11/2000 | Hamamoto | 385/131 |
| 6,661,960 | B2 | * | 12/2003 | Hamamoto | 385/131 |
| 6,687,267 | B2 | * | 2/2004 | Bukkems | 372/20 |
| 6,718,094 | B1 | | 4/2004 | Devaux et al. | |
| 6,804,426 | B2 | * | 10/2004 | Lidsky et al. | 385/15 |
| 6,813,068 | B2 | * | 11/2004 | Hamamoto | 359/344 |
| 6,819,838 | B2 | * | 11/2004 | Devaux et al. | 385/39 |
| 6,973,232 | B2 | * | 12/2005 | Betty et al. | 385/29 |
| 7,184,207 | B1 | * | 2/2007 | Walker et al. | 359/344 |
| 2007/0003183 | A1 | * | 1/2007 | Shiba et al. | 385/14 |
| 2007/0258681 | A1 | * | 11/2007 | Takabayashi et al. | 385/50 |

FOREIGN PATENT DOCUMENTS

| | | |
|---|---|---|
| JP | 9-197154 | 7/1997 |
| JP | 2000-235124 | 8/2000 |
| JP | 2004-134777 | 4/2004 |
| WO | WO 99/14623 A1 | 3/1999 |

OTHER PUBLICATIONS

L.B. Soldano, et al.; "Optical Multi-Mode Interference Devices Based on Self-Imaging: Principles and Applications;" *Journal of Lightwave Technology*; vol. 13; No. 4; Apr. 1995; pp. 615-627. (13 Sheets total.).

* cited by examiner

*Primary Examiner*—Michelle R Connelly Cushwa
*Assistant Examiner*—Rhonda S Peace
(74) *Attorney, Agent, or Firm*—Kratz, Quintos & Hanson, LLP.

(57) ABSTRACT

In order to make it possible to suppress the influence of reflected light on a connection interface easily and with certainty, an optical waveguide device includes a first optical waveguide (1), a second optical waveguide (2) formed from a material or in a structure different from that of the first optical waveguide (1) and connected to the first optical waveguide (1), and a 1×1 multimode interference waveguide (3) formed by increasing the widths of the first optical waveguide (1) and the second optical waveguide (2) in the proximity of a connection interface between the first optical waveguide (1) and the second optical waveguide (2).

13 Claims, 13 Drawing Sheets

OPTICAL WAVEGUIDE DEVICE AND SEMICONDUCTOR DEVICE

This application is a continuation of international application PCT/JP05/000699 filed Jan. 20, 2005.

TECHNICAL FIELD

The present invention relates to an optical waveguide device and a semiconductor device wherein a plurality of devices are monolithically integrated.

BACKGROUND ART

At present, an optical communication system has a tendency to become a more advanced and complicated system. For example, together with higher functionalization of an optical communication system such as a WDM optical communication system, it is demanded to highly functionalize an optical waveguide device (semiconductor device) such as an optical semiconductor device (for example, semiconductor laser or the like) to be used in such an optical communication system as just mentioned.

As one of means for implementing this, it is considered a possible idea to configure an optical waveguide device (optical semiconductor device) as an optical integrated device wherein a plurality of devices are monolithically integrated.

As such an optical integrated device (optical waveguide device) as just mentioned, for example, a modulator integration type DFB laser (for example, EML; Electroabsorptive Modulated laser) is available wherein a DFB (Distributed Feed Back; distribution feedback type) laser normally used as a light source for optical communication and a modulator (for example, EA modulator; Electro-absorption Modulator) for modulating an optical output of the DFB laser are integrated. By using the modulator integration type DFB laser, when compared with a case wherein a laser and a modulator are prepared separately from each other, higher functionalization of an optical waveguide device can be implemented while achieving downsizing and reduction in cost, and in its turn, a highly functionalized WDM (Wavelength Division Multiplexing) optical communication system can be implemented.

Incidentally, in such an optical integrated device (optical waveguide device) as described above, two kinds or more of devices (optical waveguides) formed from materials or in structures different from each other are integrated on the same substrate. Therefore, it is necessary to connect devices (optical waveguides) formed from materials or in structures different from each other.

Where two devices (optical waveguides) whose materials or structures are different from each other are connected, reflection occurs on the connection interface without fail, and there is the possibility that the reflected light may cause degradation of characteristics of the devices.

For example, where a semiconductor optical amplifier is integrated, gain ripples are generated due to unintended interference by the reflected light, resulting in appearance of wavelength variation of the gain. Further, for example, where a laser is integrated, an oscillation state of the laser is destabilized by reflection returning light, and this makes stabilized operation difficult.

Therefore, in an optical waveguide device wherein a plurality of devices are integrated, it is an important subject to suppress reflection on a connection interface along which two devices (optical waveguides) are connected in order to implement stabilized operation without degrading characteristics of the integrated devices.

Here, as a technique for suppressing reflection on a connection interface, techniques disclosed, for example, in Patent Documents 1 and 2 are available.

In Patent Document 1, as shown in a schematic sectional view in FIG. 20, where an optical waveguide 100 having a core layer 100A whose refraction index is $n_1$ and another optical waveguide 101 having a core layer 101A whose refraction index is $n_2$ are connected ($n_1 > n_2$), the thickness $d_1$ (or width) of the core layer 100A whose refraction index is $n_1$ is set smaller than the thickness $d_2$ (or width) of the core layer 101A whose refraction index is $n_2$ ($d_2 > d_1$) (in other words, the thickness (or width) of the core layer having a higher refraction index is set to a relatively small thickness) and the equivalent refraction indexes of the optical waveguides 100 and 101 to be connected to each other are set so as to coincide with each other to suppress the reflection.

In this technique, since the reflection index on the connection interface increases as the difference between the equivalent refraction indexes of the optical waveguides 100 and 101 to be connected to each other increases, the equivalent refraction indexes of the optical waveguides 100 and 101 to be connected to each other are made coincide with each other to suppress the reflection.

In Patent Document 2, as shown in a schematic top plan view in FIG. 21, the connection interface between two optical waveguides 102 and 103 are set so as to be directed obliquely with respect to the advancing direction of light (optical waveguide direction) to prevent returning of the reflected light reflected on the connection interface to the optical waveguides thereby to suppress the influence of reflection on the connection interface.

Patent Document 1: Japanese Patent Laid-Open No. 2000-235124

Patent Document 2: Japanese Patent Laid-Open No. HEI 9-197154

DISCLOSURE OF THE INVENTION

Problems to be Solved by the Invention

However, the two reflection suppressing methods described above have such subjects as described below.

First, according to the method disclosed in Patent Document 1 (that is, a method wherein the thickness (or width) of a core layer is adjusted to make equivalent refraction indexes coincide with each other), while the reflection can be suppressed to $10^{-6}$ or less from a view point of the design, it is difficult to actually achieve the width (or thickness) given by the design, and also it is difficult to control the composition of the semiconductor material.

Generally, where two optical waveguides are connected, a method called butt joint coupling is used.

Where two optical waveguides are combined by the butt joint coupling, layers which are to form one optical waveguide 104 are deposited first as shown in FIG. 22 (a) and a mask 106 is applied to a region which is to form the optical waveguide 104 as shown in FIG. 22 (b), and then the layers in regions other than the region just mentioned are removed by etching as shown in FIG. 22 (c). Consequently, the optical waveguide 104 is formed. Next, as shown in FIG. 22 (d), layers which form the other optical waveguide 105 are deposited in the regions from which the layers are removed by etching. At this time, the layers which form the optical waveguide 105 are not deposited on the mask 106. Consequently, the optical waveguide 105 is formed and butt joint coupled to the optical waveguide 104.

Where the two optical waveguides 104 and 105 are connected by such butt joint coupling as described above, when the layers which form the optical waveguide 105 are deposited, the optical waveguide 104 is formed already, and a difference in level appears on the boundary between the region in which the optical waveguide 104 is formed and the region in which the optical waveguide 105 is formed.

If the layers which form the optical waveguide 105 are deposited in a state wherein the difference in level is formed as described above, then the thickness (or width) of each layer in the proximity region of the difference in level (which functions as a connection interface between the two optical waveguides) becomes different from that in the planar region other than the proximity region of the difference in level. Further, also the composition of the material of each layer becomes different between that in the proximity region of the difference in level and that in the region other than the proximity region. In other words, it is difficult to produce the structure (thickness, composition) in the proximity of the connection interface of the optical waveguide 105 in accordance with the design. As a result, reflection of the $1 \times 10^{-5}$ order remains as reflection on the connection interface.

Next, according to the method of Patent Document 2 (in particular, a method wherein the connection interface is set obliquely), while etching must be performed obliquely with respect to a direction (waveguide direction) along an optical waveguide upon etching when the butt joint coupling is performed, since, where wet etching is used, the etching speed in the waveguide direction is lower than that in the perpendicular direction, it is difficult to produce a face extending in an oblique direction with respect to the waveguide direction [(1-10) direction] of a normal optical semiconductor device. On the other hand, while a method wherein dry etching is used is available, control of the depth of etching requires time and labor, and there is the possibility that damage may be applied to one of the different optical waveguides. Therefore, it is very difficult to set the connection interface obliquely while the characteristics of the optical waveguide are compensated for.

The present invention has been made in view of such subjects as described above, and it is an object of the present invention to provide an optical waveguide device and a semiconductor device wherein the influence of reflected light on a connection interface can be suppressed easily and with certainty.

Means for Solving the Subject

Therefore, according to the present invention, there is provided an optical waveguide device comprising a first optical waveguide, a second optical waveguide formed from a material or in a structure different from that of the first optical waveguide and connected to the first optical waveguide, and a 1×1 multimode interference waveguide formed by increasing the widths of the first and second optical waveguides in the proximity of a connection interface between the first and second optical waveguides.

According to the present invention, there is provided another optical waveguide device comprising a first optical waveguide, a second optical waveguide formed from a material or in a structure different from that of the first optical waveguide and connected to the first optical waveguide, and a 1×1 multimode interference waveguide provided between the first and second optical waveguides and including a portion formed from a material or in a structure same as that of the first optical waveguide and another portion formed from a material or in a structure same as that of the second optical waveguide.

According to the present invention, there is provided a semiconductor device wherein a semiconductor optical amplifier and a phase controller are integrated, comprising an active waveguide, a phase controlling waveguide formed from a material or in a structure different from that of the active waveguide and connected to the active waveguide, a 1×1 multimode interference waveguide provided between the active waveguide and the phase controlling waveguide and including an active waveguide structure region formed from a material or in a structure same as that of the active waveguide and a phase controlling waveguide structure region formed from a material or in a structure same as that of the phase controlling waveguide, an active waveguide electrode provided above the active waveguide and the active waveguide structure region of the 1×1 multimode interference waveguide, and a phase controlling waveguide electrode provided above the phase controlling waveguide, the semiconductor optical amplifier including the active waveguide, the active waveguide structure region of the 1×1 multimode interference waveguide and the active waveguide electrode, the phase controller including the phase controlling waveguide and the phase controlling waveguide electrode.

According to the present invention, there is provided another semiconductor device wherein a DFB laser, a semiconductor optical amplifier and an intensity modulator are integrated, comprising an active waveguide, an intensity modulation waveguide formed from a material or in a structure different from that of the active waveguide and connected to the active waveguide, a 1×1 multimode interference waveguide provided between the active waveguide and the intensity modulation waveguide and including an active waveguide structure region formed from a material or in a structure same as that of the active waveguide and an intensity modulation waveguide structure region formed from a material or in a structure same as that of the intensity modulation waveguide, an active waveguide electrode provided above the active waveguide and the active waveguide structure region of the 1×1 multimode interference waveguide, and an intensity modulation waveguide electrode provided above the intensity modulation waveguide, the DFB laser including the active waveguide and the active waveguide electrode, the semiconductor optical amplifier including the active waveguide structure region of the 1×1 multimode interference waveguide and the active waveguide electrode, the intensity modulator including the intensity modulation waveguide and the intensity modulation waveguide electrode.

Effect of the Invention

Accordingly, with the optical waveguide devices and the semiconductor devices of the present invention, there is an advantage that, where an optical waveguide device is produced wherein waveguides different in kind from each other are integrated on the same substrate, only if the position of the connection interface is adjusted, then the influence of reflected light on the connection interface can be suppressed easily and with certainty while characteristics of the optical waveguides are compensated for. As a result, in an optical waveguide device wherein waveguides different in kind from each other are integrated on the same substrate, stabilized operation can be implemented.

Figure 1:
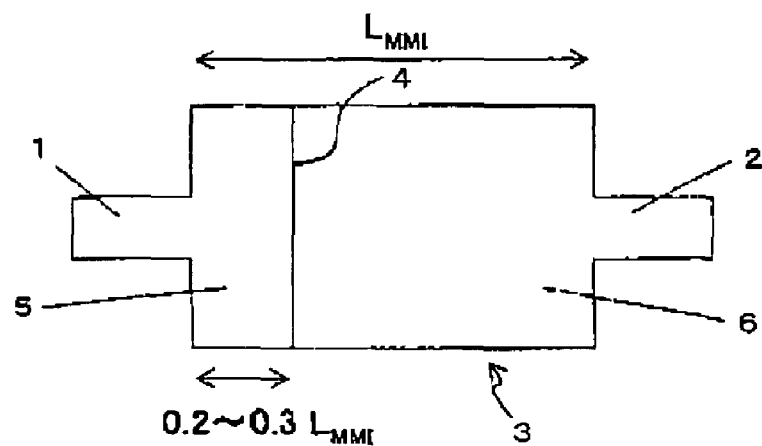
FIG. 1 is a schematic view showing an example of a configuration of a symmetric 1×1 MMI waveguide included in an optical waveguide device according to a first embodiment of the present invention.

DESCRIPTION OF REFERENCE CHARACTERS 1, 2 optical waveguide
1A active waveguide
2A phase controlling waveguide
2B intensity modulation waveguide
3 symmetric 1×1 MMI waveguide
31 asymmetric 1×1 MMI waveguide
4 connection interface
5 first connection section
6 second connection section
7a to 7d end face
10 phase controller integrated type SOA
10A SOA section (SOA region)
10B phase controller section (phase controller region)
10C separation section (separation region)
11 active waveguide electrode
12 phase controlling waveguide electrode
13 reflection film
14, 24 anti-reflection film
15 n-InP layer
16 MQW active layer
17 p-InP layer
18, 21 contact layer
19 N-side electrode
20 phase controlling layer
22 SiO$_2$ film 23 modulator integrated type DFB laser
23A DFB laser section (DFB laser region)
23B modulator section (modulator region)
23C SOA section (SOA region)
23D separation section (separation region)
25 diffraction grating layer
26 n-InP layer
27 MQW modulation layer

BEST MODE FOR CARRYING OUT THE INVENTION

In the following, an optical waveguide device and a semiconductor device according to embodiments of the present invention are described with reference to FIGS. 1 to 19 of the drawings.

First Embodiment

First, an optical waveguide device (optical waveguide element) and a semiconductor device (semiconductor element) according to a first embodiment of the present invention are described with reference to FIGS. 1 to 10.

Figure 2:
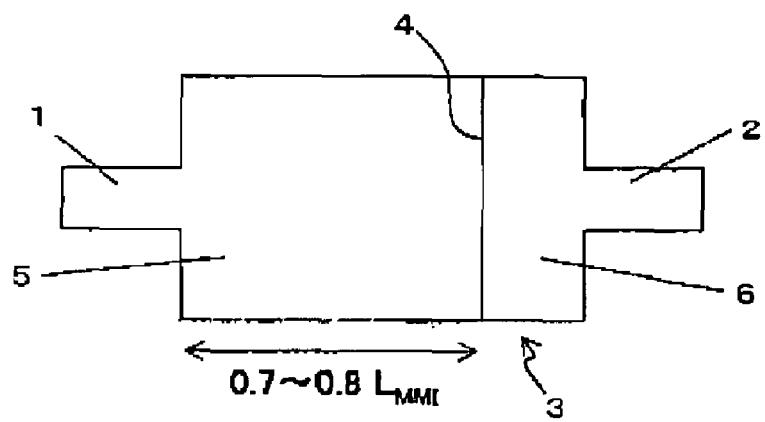
FIG. 2 is a schematic view showing another example of the configuration of the symmetric 1×1 MMI waveguide included in the optical waveguide device according to the first embodiment of the present invention.

As shown in FIGS. 1 and 2, the optical waveguide device according to the present embodiment includes at least two kinds of optical waveguides (optical waveguide elements) 1 and 2 formed from materials or in structures different from each other on one substrate, and the optical waveguides 1 and 2 are connected to each other through a 1×1 multimode interference (MMI; MultiMode Interference) waveguide 3. Here, a connection interface (connection plane) 4 between the two kinds of the optical waveguides 1 and 2 is provided so as to be contained in the inside of the 1×1 MMI waveguide 3.

As shown in FIGS. 1 and 2, the present optical waveguide device includes the first optical waveguide (first single-mode waveguide) 1, the second optical waveguide (second single-mode waveguide) 2 formed from a material or in a structure different from that of the first optical waveguide 1 and connected to the first optical waveguide 1, and the 1×1 MMI waveguide 3 formed by increasing the width of the first and second optical waveguides 1 and 2 in the proximity of the connection interface 4. It is to be noted here that a narrow portion of the first optical waveguide 1 (portion which does not form the 1×1 MMI waveguide 3) functions as an input waveguide, and a narrow portion of the second optical waveguide 2 (portion which does not form the 1×1 MMI waveguide 3) functions as an output waveguide.

Here, in order to connect the first optical waveguide (first single-mode waveguide) 1 and the second optical waveguide (second single-mode waveguide) 2, the width of the first optical waveguide 1 is increased to form a first connection section 5 and the width of the second optical waveguide 2 is increased to form a second connection section 6, and the 1×1 MMI waveguide 3 is formed from the first and second connection sections 5 and 6 such that the end faces of the first and second connection sections 5 and 6 are connected to each other.

In particular, in order to connect the first optical waveguide (first single-mode waveguide) 1 and the second optical waveguide (second single-mode waveguide) 2, the 1×1 MMI waveguide 3 having the portion (first connection section 5) formed from a material or in a structure same as that of the first optical waveguide 1 and the portion (second connection section 6) formed from a material or in a structure same as that of the second optical waveguide 2 is provided between the first and second optical waveguides 1 and 2.

The single input waveguide (first optical waveguide, first single-mode waveguide) 1 and the single output waveguide (second optical waveguide, second single-mode waveguide) 2 are connected to the present 1×1 MMI waveguide 3 such that the 1×1 MMI waveguide 3 can reproduce the light intensity distribution of the input light inputted from the input waveguide 1 as the output light to be outputted from the output waveguide 2.

In the present embodiment, as shown in FIGS. 1 and 2, the 1×1 MMI waveguide 3 is configured as a symmetric 1×1 MMI waveguide having an input port and an output port at the central position in the widthwise direction thereof.

Further, in the present embodiment, the connection interface 4 between the two kinds of the optical waveguides 1 and 2 extends perpendicularly to the direction (waveguide direction, optical axis direction, optical waveguide direction) along the optical waveguides 1 and 2. It is to be noted, however, that the connection interface 4 may be formed obliquely with respect to a plane perpendicular to the waveguide direction.

Particularly, in the present embodiment, as shown in FIGS. 1 and 2, the connection interface 4 between the two kinds of the optical waveguides 1 and 2 is positioned at a distance of 0.2 to 0.3 times (0.2 to 0.3 $L_{MMI}$) or 0.7 to 0.8 times (0.7 to 0.8 $L_{MMI}$) the length $L_{MMI}$ of the symmetric 1×1 MMI waveguide 3 from the input side.

In this manner, in the present embodiment, by positioning the connection interface 4 between the two kinds of the optical waveguides 1 and 2 at a distance of 0.2 to 0.3 times or 0.7 to 0.8 times the length $L_{MMI}$ of the symmetric 1×1 MMI waveguide 3 from the input side, the influence of reflected light on the connection interface 4 is suppressed utilizing a phenomenon of self-imaging of the MMI waveguide. In particular, even if the input light is reflected at a predetermined reflectance on the connection interface 4, the present invention can suppress, by contriving the position of the connection interface 4, the light intensity of the reflected light coupled to the input waveguide 1 and can decrease the effective reflectance for the input light thereby to suppress the influence of the reflected light.

The self-imaging phenomenon of the MMI waveguide and the principle for suppressing the influence of the reflected light utilizing the phenomenon are described below with reference to FIG. 3.

Figure 3:
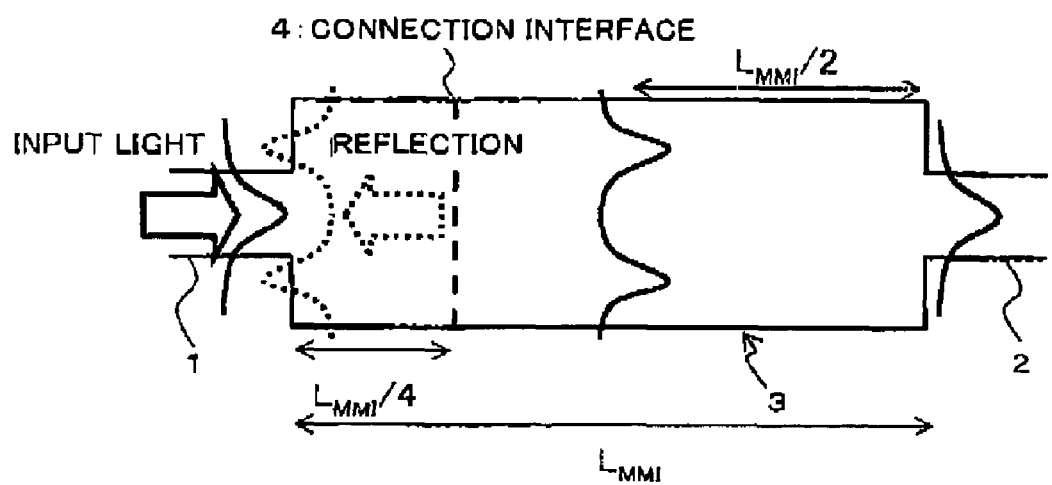
FIG. 3 is a schematic view illustrating a reflection suppression principle by the symmetric 1×1 MMI waveguide included in the optical waveguide device according to the first embodiment of the present invention.

As shown in FIG. 3, the optical waveguides 1 and 2 are connected to the input and output sides of the MMI waveguide 3, respectively. The width of the MMI waveguide 3 is greater than the widths of the input side optical waveguide (input waveguide) 1 and the output side optical waveguide (output waveguide) 2 so that higher-order transverse modes are generated therein. Incident light (inputted light) from the input waveguide 1 is divided into multi-modes and propagates in the MMI waveguide 3. Then, when the light of the divided modes propagate by a particular distance, a self-imaging phenomenon occurs that the light of the divided modes interfere with each other and the light intensity distribution returns to that of the single transverse mode upon incidence. Therefore, if the length $L_{MMI}$ of the MMI waveguide 3 is designed so as to be equal to the particular distance for self-imaging, then it is possible to return the light intensity distribution to that of the single-mode upon incidence almost without any loss.

Here, in the symmetric 1×1 MMI waveguide 3, the input waveguide 1 is connected to the central position in the widthwise direction on the input side and the output waveguide 2 is connected to the central position in the widthwise direction on the output side. In the MMI waveguide 3, if the input waveguide 1 is connected to the central position in the widthwise direction, then an image is formed at the central position in the widthwise direction on the output side. Therefore, in the symmetric 1×1 MMI waveguide 3, the input and output ports are provided at the central position in the widthwise direction and the input and output waveguides 1 and 2 are connected.

As shown in FIG. 3, in the symmetric 1×1 MMI waveguide 3, the light intensity distribution of the inputted light becomes a light intensity distribution which has two peaks at the place at which the inputted light propagates half as much as the length of the MMI waveguide 3. In particular, at the position of 0.5 times ($L_{MMI}/2$) the length $L_{MMI}$ of the MMI waveguide 3, the light intensity of the inputted light at the central position in the widthwise direction of the MMI waveguide 3 to which the input waveguide 1 is connected becomes low.

Therefore, if the connection interface 4 is provided at the position of 0.25 times ($L_{MMI}/4$) the length $L_{MMI}$ of the symmetric 1×1 MMI waveguide 3 as indicated by a broken line in FIG. 3, then the light reflected on the connection interface 4 propagates by a distance of 0.5 times ($L_{MMI}/2$) the length $L_{MMI}$ of the symmetric 1×1 MMI waveguide 3 before the reflected light returns to the input port (inputting section) of the symmetric 1×1 MMI waveguide 3.

In this instance, the light intensity distribution of the light reflected on the connection interface 4 at the input port of the symmetric 1×1 MMI waveguide 3 becomes equal to that at the position of 0.5 times ($L_{MMI}/2$) the length $L_{MMI}$ of the symmetric 1×1 MMI waveguide 3 described above as indicated by a broken line in FIG. 3, and the light intensity at the central position in the widthwise direction of the symmetric 1×1 MMI waveguide 3 to which the input waveguide 1 is connected becomes low.

Accordingly, in the case of the symmetric 1×1 MMI waveguide 3, if the connection interface 4 is provided at the position of 0.25 times ($L_{MMI}/4$) the length $L_{MMI}$ of the symmetric 1×1 MMI waveguide 3, then the reflected light to be coupled to the input waveguide 1 can be reduced (light intensity of the reflected light can be reduced), and the influence of the reflected light can be suppressed.

It is to be noted that, even if the connection interface 4 is provided at the position of 0.75 times ($3 L_{MMI}/4$) the length $L_{MMI}$ of the symmetric 1×1 MMI waveguide 3, the influence of the reflected light can be suppressed similarly.

In particular, if the connection interface 4 is provided at the position of 0.75 times ($3 L_{MMI}/4$) the length $L_{MMI}$ of the symmetric 1×1 MMI waveguide 3, then the light reflected on the connection interface 4 propagates by a distance of 1.5 times ($3 L_{MMI}/2$) the length $L_{MMI}$ of the symmetric 1×1 MMI waveguide 3 before the reflected light returns to the input port of the symmetric 1×1 MMI waveguide 3.

In this instance, according to the light intensity distribution of the light reflected on the connection interface 4 at the input port of the symmetric 1×1 MMI waveguide 3, the light intensity at the central position in the widthwise direction of the symmetric 1×1 MMI waveguide 3 to which the input waveguide 1 is connected becomes low similarly to that in the case described above wherein the connection interface 4 is provided at the position of 0.25 times ($L_{MMI}/4$) the length $L_{MMI}$ of the symmetric 1×1 MMI waveguide 3 (refer to dotted line in FIG. 3).

Consequently, the reflected light to be coupled to the input waveguide 1 can be reduced (light intensity of the reflected light can be reduced), and the influence of the reflected light can be suppressed.

Figure 4:
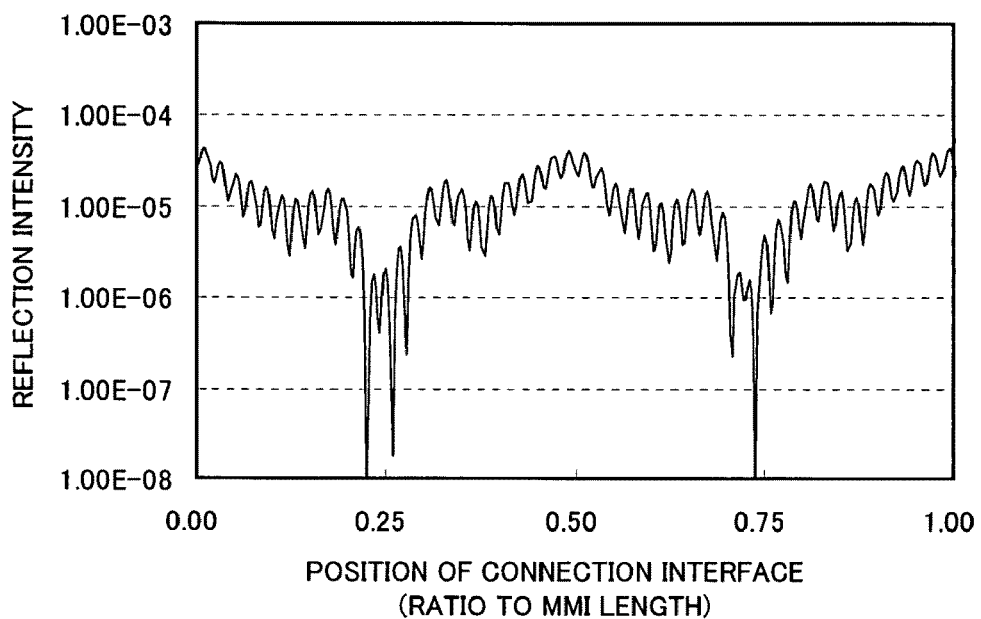
FIG. 4 is a view showing a relationship between the position of the connection interface and the reflection intensity in the symmetric 1×1 MMI waveguide included in the optical waveguide device according to the first embodiment of the present invention.
Figure 5:
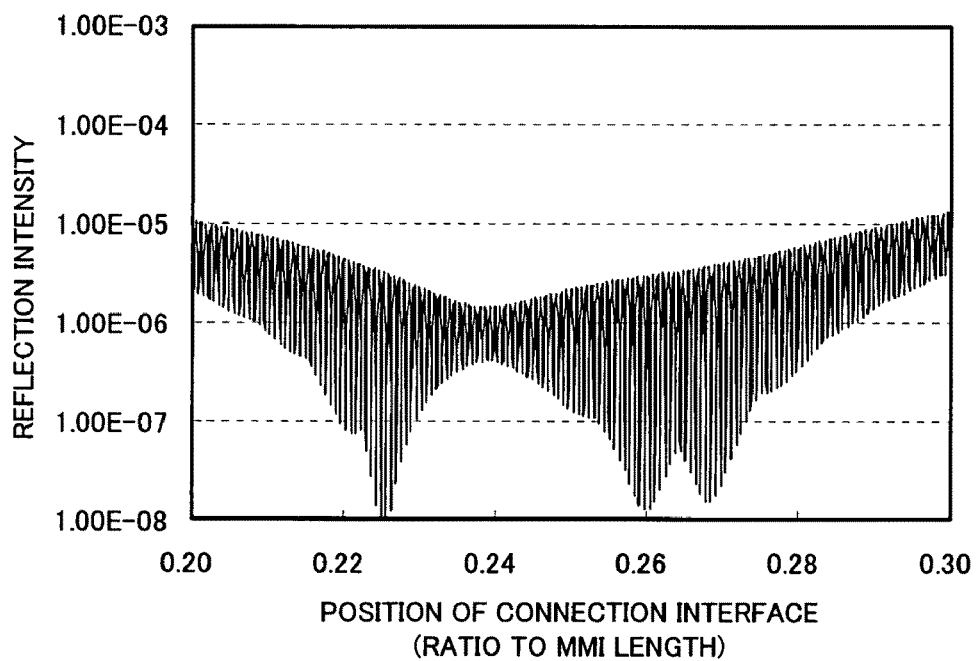
FIG. 5 is a view showing a relationship between the position of the connection interface and the reflection intensity in the symmetric 1×1 MMI waveguide included in the optical waveguide device according to the first embodiment of the present invention.

Here, FIG. 4 is a view showing a result where the light intensity (reflection intensity) of the reflected light returning to the input waveguide 1 when the position (ratio with respect to the MMI length) of the connection interface 4 is successively changed in the symmetric 1×1 MMI waveguide 3 is calculated. Meanwhile, FIG. 5 is a view showing in an enlarged form the position especially at which the reflection is suppressed within the result of the calculation in FIG. 4. It is to be noted that, in this calculation, a case is assumed wherein approximately $6 \times 10^{-5}$ reflection occurs on the connection interface 4.

As apparent from the result of the calculation in FIG. 4, it is recognized that, in the symmetric 1×1 MMI waveguide 3, the reflection intensity is suppressed where the connection interface 4 is provided at a position in the proximity of 0.25 times ($L_{MMI}/4$) or 0.75 times ($3 L_{MMI}/4$) the length (MMI length) $L_{MMI}$ of the symmetric 1×1 MMI waveguide 3. In other words, it is recognized that the reflection intensity is suppressed not only at the position of just 0.25 times ($L_{MMI}/4$) or 0.75 times ($3 L_{MMI}/4$) but also at a position around the position just mentioned, that is, at a position of 0.2 to 0.3 times or 0.7 to 0.8 times.

More particularly, as apparent from the result of the calculation in FIG. 5, it is recognized that, if the connection interface 4 is provided at the position of 0.2 to 0.3 times the length (MMI length) $L_{MMI}$ of the symmetric 1×1 MMI waveguide 3, then the reflection intensity can be suppressed to the order of approximately $10^{-6}$. Further, it can be recognized apparently from the results of the calculation in FIGS. 4 and 5 that, if the connection interface 4 is provided at the position of 0.7 to 0.8 times the length (MMI length) $L_{MMI}$ of the symmetric 1×1 MMI waveguide 3, then the reflection intensity can be suppressed to the order of approximately $10^{-6}$.

Therefore, in the present embodiment, the connection interface 4 between the two kinds of the single-mode waveguides 1 and 2 is provided at the position of 0.2 to 0.3 times (0.2 to 0.3 $L_{MMI}$) or 0.7 to 0.8 times (0.7 to 0.8 $L_{MMI}$) the length $L_{MMI}$ of the symmetric 1×1 MMI waveguide 3 from the input side as described above.

Accordingly, with the present embodiment, there is an advantage that, where an optical waveguide device wherein different kinds of waveguides are integrated on the same substrate is manufactured, only if the position of the connection interface 4 is adjusted, then the influence of reflected light on the connection interface 4 can be suppressed easily and with certainty while the characteristics of the optical waveguides are compensated for. As a result, stabilized operation can be implemented in the optical waveguide device wherein different kinds of waveguides are integrated on the same substrate.

It is to be noted that, while, in the embodiment described above, the influence of reflected light is suppressed utilizing the light intensity distribution having two peaks at the position of 0.5 times ($L_{MMI}/2$) the length $L_{MMI}$ of the symmetric 1×1 MMI waveguide 3, the present invention is not limited to this, and also it is possible to suppress the influence of the reflected light utilizing a light intensity distribution having a greater number of peaks (light intensity at the central position in the widthwise direction of the MMI waveguide 3 is low).

For example, also it is possible to suppress the influence of the reflected light utilizing a light intensity distribution having four peaks at the position of 0.25 times ($L_{MMI}/4$) the length $L_{MMI}$ of the symmetric 1×1 MMI waveguide 3. In this instance, the connection interface 40 may be provided at a position of 0.125 times ($L_{MMI}/8$) the length (MMI length) $L_{MMI}$ of the symmetric 1×1 MMI waveguide 3. Further, for example, also it is possible to suppress the influence of the reflected light utilizing a light intensity distribution having six peaks at a position of 0.166 times ($L_{MMI}/6$) the length $L_{MMI}$ of the symmetric 1×1 MMI waveguide 3. In this instance, the connection interface 4 may be provided at a position of 0.083 times ($L_{MMI}/12$) the length (MMI length) $L_{MMI}$ of a symmetric 1×1 MMI waveguide 30. In short, where a light intensity distribution having n (n: even number) peaks is utilized, the connection interface 40 may be provided at the position of $L_{MMI}/2n$.

However, the distance (region wherein the light intensity is low) between peaks decreases as the number of peaks of the light intensity distribution increases. Therefore, in order to sufficiently decrease the light intensity of the reflected light to be coupled to the input waveguide 1, it is preferable to utilize the light intensity distribution having two peaks at the position of 0.5 times ($L_{MMI}/2$) the length $L_{MMI}$ of the symmetric 1×1 MMI waveguide 3.

Further, if the distance (region wherein the light intensity is low) between peaks of the light intensity distribution increases, then a higher suppression effect can be obtained. Therefore, in order to increase the distance (region wherein the light intensity is low) between peaks of the light intensity distribution, also it is preferable to increase the width of the symmetric 1×1 MMI waveguide 3. However, since, if the width is increased, then also the length must be increased, it is not preferable to increase the width from a view point of downsizing of the device.

Next, a semiconductor optical amplifier (SOA: Semiconductor Optical Amplifier, semiconductor device, semiconductor element) wherein a phase controller is integrated is described as an example of an optical waveguide device having such a configuration as described above with reference to FIGS. 6 to 8.

Figure 6:
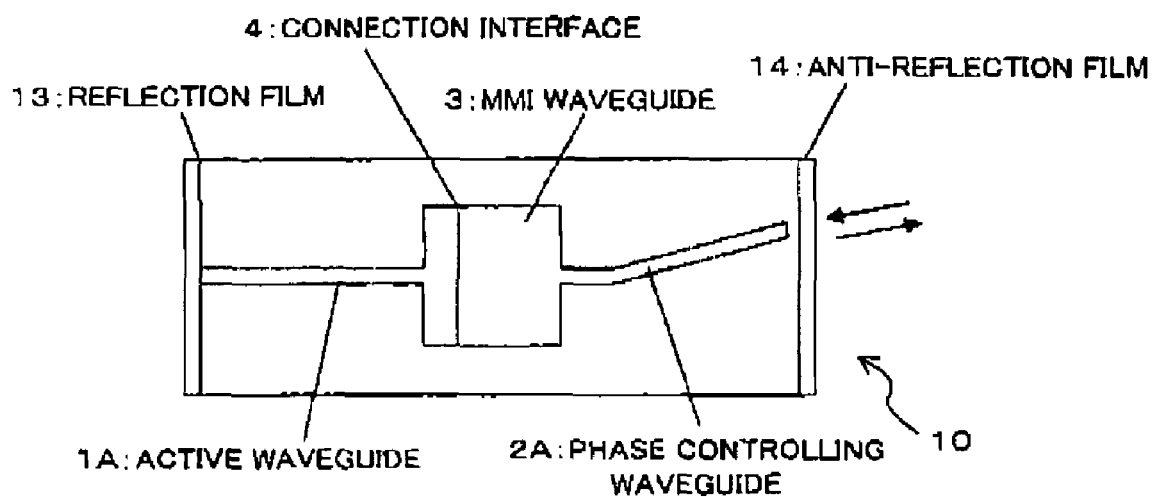
FIG. 6 is a schematic view showing a configuration (mainly, waveguide structure) of a phase controller integrated type SOA as an example of a semiconductor device according to the first embodiment of the present invention.

As shown in FIG. 6, a phase controller integrated type SOA 10 includes an active waveguide (first optical waveguide, first single-mode waveguide, optical waveguide device, semiconductor device) 1A capable of generating a gain by current injection, a phase controlling waveguide (second optical waveguide, second single-mode waveguide, optical waveguide device, semiconductor device) 2A capable of changing the refraction index by current injection to change the phase and a symmetric 1×1 MMI waveguide 3, and the optical waveguides 1A and 2A formed from different materials or in different structures are integrated into one device.

Here, the width of the active waveguide 1A and phase controlling waveguide 2A (waveguide width of portions spaced from the connection interface 4) is set to approximately 1.6 μm. Further, the length of the active waveguide 1A (other than the portion which forms the MMI waveguide 3) is set to approximately 800 μm, and the length of the phase controlling waveguide 2A (other than the portion which forms the MMI waveguide 3) is set to approximately 200 μm.

Further, the active waveguide 1A and the phase controlling waveguide 2A are connected to each other through the symmetric 1×1 MMI waveguide 3. On the other hand, in the proximity of the connection interface 4 between the active waveguide 1A and the phase controlling waveguide 2A, the waveguide has a symmetric 1×1 MMI structure. Here, the width and length (MMI length) of the symmetric 1×1 MMI waveguide 3 are set to approximately 8 μm and 180 μm, respectively. It is to be noted that, if the refraction indexes of materials of the MMI waveguide 3 and the outside of the MMI waveguide 3, the widths of the active waveguide 1A and the phase controlling waveguide 2A as the input and output waveguides and the width of the MMI waveguide 3 are determined, then theoretically optimum design regarding the length of the MMI waveguide 3 exists. For example, B. Lucas et al, Journal of Lightwave Technology, vol. 13, No. 4, 1995 is referred to as a document regarding a multi-mode interference waveguide.

Further, as shown in FIG. 6, the connection interface 4 between the active waveguide 1A and the phase controlling waveguide 2A is provided in the inside of the symmetric 1×1 MMI waveguide 3. Here, the connection interface 4 is provided at a position of 0.2 to 0.3 times the length of the MMI waveguide 3 from the input side. Naturally, as described above, the connection interface 4 may be provided at a position of 0.7 to 0.8 times the length of the MMI waveguide 3 from the input side. Above all, if the connection interface 4 is provided at a position of 0.25 or 0.75 times the length of the MMI waveguide 3 from the input side, then a structure wherein the influence of the reflected light on the connection interface 4 can be suppressed most is obtained.

It is to be noted that, the design of the MMI waveguide 3 is somewhat different depending upon the material or the structure of the waveguides. Therefore, for example, where the connection interface 4 is provided at a position of 0.25 times the length (MMI length) of the MMI waveguide 3 from the active layer waveguide 1A side, that is, where the portion (active waveguide structure portion) formed from a material and in a structure same as those of the active layer waveguide 1A occupies ¼ the MMI waveguide 3 and the portion (phase controlling waveguide structure portion) formed from a material and in a structure same as those of the phase controlling waveguide 2A occupies ¾ the MMI waveguide 3, it is preferable for the active waveguide structure portion to be set to the length of ¼ the MMI length which is set where the entire MMI waveguide 3 is designed as the active waveguide structure while the phase controlling waveguide structure portion is set to the length of ¾ the MMI length which is set where the entire MMI waveguide 3 is designed as the phase controlling waveguide structure.

Control of the shape (width, length and so forth) of the active layer waveguide 1A, phase controlling waveguide 2A and MMI waveguide 3 can be performed, for example, by common dry etching using a $SiO_2$ mask or the like. Only if the pattern of the $SiO_2$ mask is changed, the patterns of the active layer waveguide 1A, phase controlling waveguide 2A and MMI waveguide 3 can be implemented easily.

Figure 7:
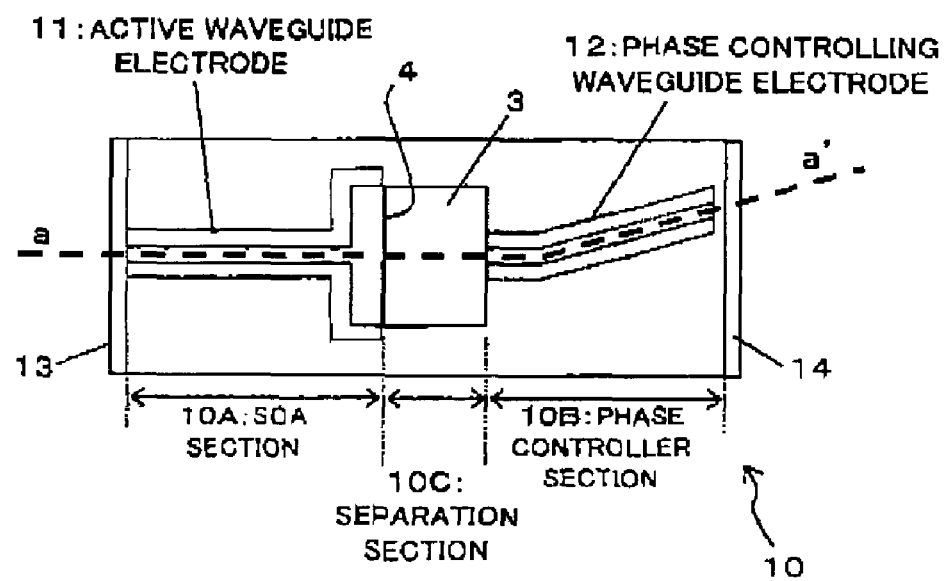
FIG. 7 is a schematic view showing a configuration (mainly, electrode structure) of the phase controller integrated type SOA as an example of the semiconductor device according to the first embodiment of the present invention.
Figure 8:
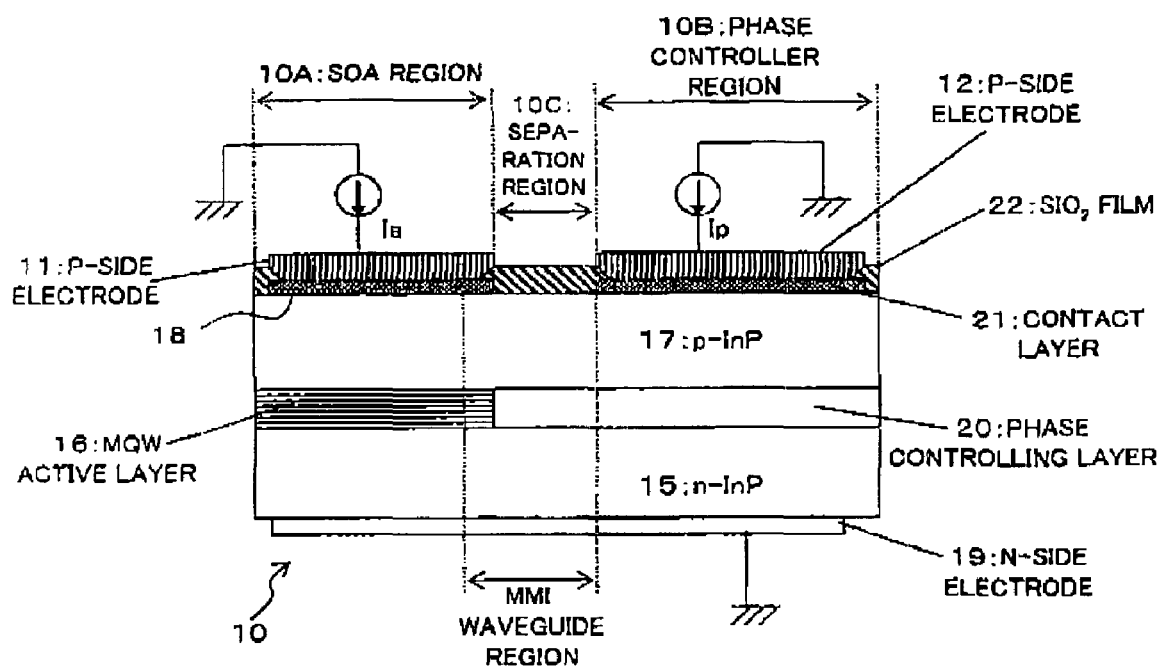
FIG. 8 is a schematic view showing a layer configuration of the phase controller integrated type SOA as an example of the semiconductor device according to the first embodiment of the present invention.

Further, as shown in FIGS. 7 and 8, electrodes (here, p-side electrodes) 11 and 12 separated from each other are formed on an element surface (device surface) above the region including the waveguides 1A and 2A such that current can be injected independently to the regions including the waveguides 1A and 2A. In particular, as shown in FIGS. 7 and 8, the active waveguide electrode 11 is formed on the device surface above the region including the active waveguide 1A, and the phase controlling waveguide electrode 12 is formed on the device surface above the region including the phase controlling waveguide 2A.

Further, as shown in FIGS. 6 and 7, a reflection film 13 is formed on the end face on the active waveguide 1A side, and an anti-reflection film 14 is formed on the end face on the phase controlling waveguide 2A side. By applying such a structure as just described, a reflection type SOA can be implemented wherein input light is introduced from the end face (anti-reflection end face) on the side on which the anti-reflection film 14 is formed and the incident light is amplified by a SOA section 10A including the active waveguide 1A and then the phase is controlled by a phase controller section 10B including the phase controlling waveguide 2A, whereafter the light emits as output light from the anti-reflection end face. It is to be noted that the arrangement of the active waveguide 1A and the phase controlling waveguide 2A described above is one example, and, for example, the waveguides 1A and 2A may be arranged reversely.

In this manner, in the present phase controller integrated type SOA 19, light is inputted from the phase controlling waveguide 2A to the MMI waveguide 3 and the light is outputted from the active waveguide 1A, and on the other hand, light is inputted from the active waveguide 1A and the light is outputted from the phase controlling waveguide 2A. In other words, both of the active waveguide 1A and the phase controlling waveguide 2A function not only as input waveguides but also as output waveguides.

Here, in the case of the symmetric 1×1 MMI waveguide 3, if the connection interface 4 is provided at a position of approximately 0.25 times ($L_{MMI}/4$) (within a range of 0.2 to 0.3 times) or approximately 0.75 times (3 $L_{MMI}/4$) (within a range of 0.7 to 0.8 times) the length $L_{MMI}$ of the MMI waveguide 3 from the input side as described above, then the effect of suppressing the influence of reflected light can be obtained. In other words, in the case of the symmetric 1×1 MMI waveguide 3, if the connection interface 4 is provided at the position of $L_{MMI}/4$ from the input side in order to suppress the influence of the reflected light, then the connection interface 4 is provided at the position of 3 $L_{MMI}/4$ from the output side. Therefore, even if the input side and the output side are reversely placed, since the connection interface 4 is provided at the position of 3 $L_{MMI}/4$ from the input side, the effect of suppressing the influence of the reflected light can be obtained.

Therefore, in the present phase controller integrated type SOA 10, by using the symmetric 1×1 MMI waveguide 3 as the MMI waveguide 3, even if light is inputted from any one of the opposite sides, the influence of the reflected light can be suppressed. In this manner, in the case of the semiconductor device having such a configuration that light is inputted from both of one side and the other side of the MMI waveguide 3 as described above, if the symmetric 1×1 MMI waveguide 3 is used, then even if light is inputted from any one of the opposite sides, the influence of the reflected light can be suppressed.

Further, in order to prevent returning of light reflected on the device end face or the anti-reflection film 14, the phase controlling waveguide 1B extending to the end face on which the anti-reflection film 14 is formed has a structure wherein the waveguide 1B is bent obliquely with respect to the device end face as shown in FIG. 6. Further, in order to prevent returning of light reflected on the device end face or the anti-reflection film 14, the phase controlling waveguide 1B is formed such that a gap is provided between the end portion of the phase controlling waveguide 1B and the device end face to form a window structure near to the end face as shown in FIG. 6.

Next, a layer structure of the phase controller integrated type SOA 10 configured in such a manner as described above is described with reference to FIG. 8 (schematic sectional view taken along a broken line denoted by a-a' in FIG. 7).

First, the active waveguide 1A has a layer structure wherein, for example, an n-type InP buffer layer, a 1.55 μm band strained MQW layer (Multiple Quantum Well; multiple quantum well layer)+SCH (Separate Confinement Heterostructure) layer (InGaAsP layer), a p-type InP cladding layer, a p-type InGaAsP contact layer and a p-type InGaAs contact layer are stacked in order on an n-type InP substrate. In particular, as shown in FIG. 8, the active waveguide 1A has a layer structure wherein an n-InP layer (n-type InP substrate, n-type InP buffer layer) 15, an MQW active layer (1.55 μm band strained MQW layer+SCH layer) 16, a p-InP layer (p-type InP cladding layer) 17, and a contact layer (p-type InGaAsP contact layer, p-type InGaAs contact layer) 18 are stacked in order.

Then, as shown in FIG. 8, in order to inject current Ia, the P-side electrode (active waveguide electrode) 11 is formed on the top face of the region of the active waveguide 1A having such a layer structure as described above, and the N-side electrode (common electrode) 19 is formed on the bottom face of the region of the active waveguide 1A.

On the other hand, the phase controlling waveguide 2A has a layer structure wherein, for example, an n-type InP buffer layer, a 1.3 μm composition InGaAsP core layer, a p-type InP cladding layer, a p-type InGaAsP contact layer, and a p-type InGaAs contact layer are stacked in order on an n-type InP substrate. In particular, as shown in FIG. 8, the phase controlling waveguide 2A has a layer structure wherein an n-InP layer (n-type InP substrate, n-type InP buffer layer) 15, a phase controlling layer (1.3 μm composition InGaAsP core layer) 20, a p-InP layer (p-type InP cladding layer) 17, and a contact layer (p-type InGaAsP contact layer, p-type InGaAs contact layer) 21 are stacked in order.

In this manner, the present phase controller integrated type SOA 10 is such that the SOA region 10A includes the active waveguide 1A provided with the MQW active layer 16 formed from the 1.55 μm band strained MQW layer+SCH layer while the phase controller region 10B includes the phase controlling waveguide 2A provided with the phase controlling layer 20 formed from the 1.3 μm composition InGaAsP core layer, and the optical waveguides formed from materials (compositions) and in structures different from each other are connected to each other.

Then, as shown in FIG. 8, in order to inject current Ip, the P-side electrode (phase controlling waveguide electrode) 12 is formed on the top face of the region of the phase controlling waveguide 2A having such a layer structure as described above, and the N-side electrode (common electrode) 19 is formed on the bottom face of the region of the phase controlling waveguide 2A.

It is to be noted that, as a current blocking structure for the MQW active layer 16 and the phase controlling layer 20, for example, a pn-BH structure (Buried Heterostructure) may be used.

Incidentally, here, as shown in FIGS. 7 and 8, a separation region (separation section) 10C is provided in order to electrically separate the SOA section (SOA region) 10A and the phase controller section (phase controller region) 10B from each other. In particular, the phase controlling waveguide electrode (P-side electrode) 12 and the contact layer 21 are not formed in a region above the region (phase controlling waveguide structure region) formed from a material and in a structure same as those of the phase controlling waveguide within the MMI waveguide region including the connection interface between the active waveguide 1A and the phase controlling waveguide 2A such that the separation region (separation section) 10C is formed between the SOA section (SOA region) 10A and the phase controller section (phase controller region) 10B. Therefore, the contact layer 21 and the phase controlling waveguide electrode (P-side electrode) 12 are formed only in the region just above the phase controlling waveguide 2A.

On the other hand, as shown in FIGS. 7 and 8, the active waveguide electrode (P-side electrode) 11 and the contact layer 18 are formed in a region above the active waveguide 1A within the MMI waveguide region including the connection interface between the active waveguide 1A and the phase controlling waveguide 2A. Therefore, the contact layer 18 and the active waveguide electrode (P-side electrode) 11 are formed in the region just above the active waveguide 1A including the MMI waveguide region.

In this manner, by forming the active waveguide electrode 11 also in the region just above the active waveguide 1A of the MMI waveguide region, also a portion of the MMI waveguide 3 functions as the SOA section 10A. As described above, the portion of the MMI waveguide 3, that is, the active waveguide 1A of the MMI waveguide region, includes the MQW active layer 16 formed from a 1.55 μm band strained MQW layer+ SCH layer, and light absorption of the 1.55 μm band when current is not injected is very high. Therefore, by providing the active waveguide electrode 11 also on the portion of the MMI waveguide 3 such that the portion of the MMI waveguide 3 functions as the SOA section 10A, current is usually injected so that loss by light absorption in the MMI waveguide 3 is suppressed.

On the other hand, since the other portion of the MMI waveguide 3, that is, the phase controlling waveguide structure region of the MMI waveguide region, includes the phase controlling layer 20 formed from a 1.3 μm composition InGaAsP core layer as described above, light absorption of the 1.55 μm band when current is not injected is basically low. Therefore, even if current is not injected, there is no problem. Such a waveguide as described above is called passive waveguide, and an electrode formed on such a waveguide as just mentioned is called passive waveguide electrode. Thus, no electrode is provided at the other portion of the MMI waveguide 3 such that this portion functions as the separation region (separation section) 10C for performing electrical separation between devices. In this manner, by causing the other portion of the MMI waveguide 3 to function as the electrical device separation region necessary to integrate a plurality of devices, increase of the entire device length by insertion of the MMI waveguide 3 can be suppressed to the minimum.

It is to be noted that, as shown in FIG. 8, a $SiO_2$ film (passivation film) 22 is formed in a region in which the contact layers 18 and 21, phase controlling waveguide electrode (P-side electrode) 12 and active waveguide electrode (P-side electrode) 11 are not formed. In particular, the $SiO_2$ film 22 is formed in the region in which the contact layers 18 and 21 and the P-side electrodes 11 and 12 are not formed by forming the contact layers 18 and 21, forming the $SiO_2$ film 22 on the entire surface of the contact layers 18 and 21, removing only the $SiO_2$ film 22 on the contact layers 18 and 21 and then forming the P-side electrodes 11 and 12 on the contact layers 18 and 21.

Accordingly, since, with the phase controller integrated type SOA 10 according to the present embodiment, the reflection on the connection interface 4 between the phase controlling waveguide 2A and the active waveguide 1A can be suppressed, gain ripples of the SOA arising from the reflection on the connection interface 4 can be suppressed. As a result, an SOA can be implemented which has no wavelength variation of the gain.

It is to be noted here that, while the phase controlling waveguide 2A is configured as a waveguide for changing the refraction index by current injection to change the phase, the present invention is not limited to this, and, for example, the phase controlling waveguide 2A may be configured as a waveguide capable of changing the refraction index by voltage application or temperature adjustment to control the phase. In this instance, while the layer structure of the phase controlling waveguide 2A may be similar to that described above, where changing of the refraction index is performed by voltage application, it is necessary to configure such that a voltage is applied to the electrode. Further, where changing of the refraction index is performed by temperature adjustment, it is necessary to apply a configuration capable of adjusting the temperature such as, for example, a configuration by which the temperature of the entire device can be adjusted, another configuration wherein a thin film heater is provided just above the phase controlling waveguide 2A or the like.

Next, as a different example of an optical waveguide device having such a configuration as described above, a modulator integrated type DFB laser (EML, semiconductor device, semiconductor element) is described with reference to FIGS. 9 and 10. It is to be noted that like elements to those of the phase controller integrated type SOA 10 (refer to FIGS. 6 to 8) are denoted by like reference characters in FIGS. 9 and 10.

Figure 9:
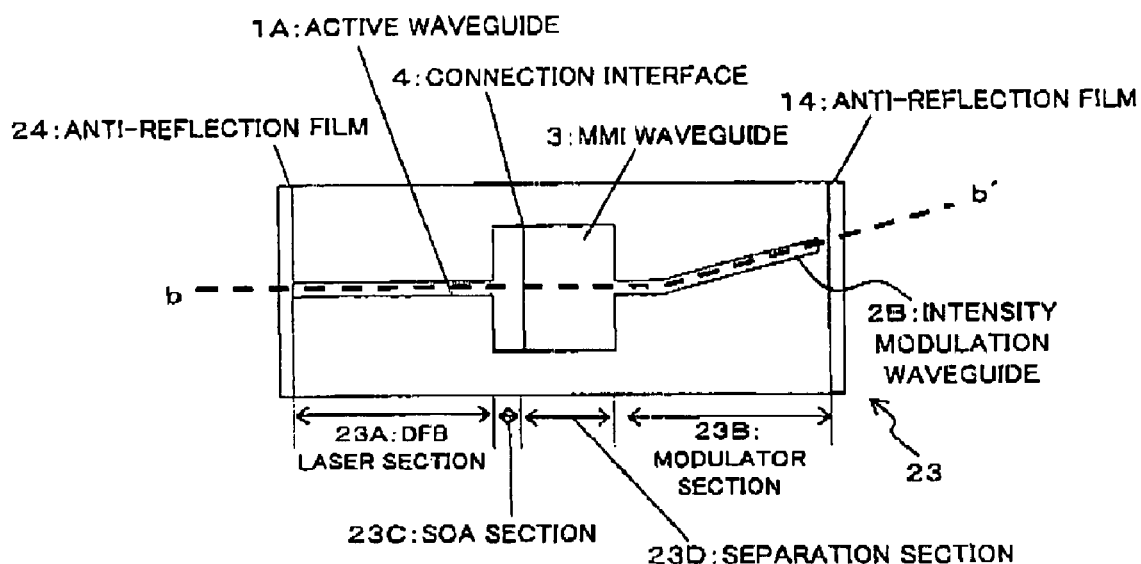
FIG. 9 is a schematic view showing a configuration of a modulator integrated type DFB laser as a different example of the semiconductor device according to the first embodiment of the present invention.

As shown in FIG. 9, a modulator integrated type DFB laser [MI (Modulator Integrate)-DFB] 23 is structured such that a DFB laser section (DFB laser region, semiconductor device) 23A which is a laser light source, an electric field absorption type modulator section (modulator region, semiconductor device) 23B capable of changing the absorption coefficient by voltage application to modulate the intensity of light (here, emitting light from the DFB laser) and an SOA section (SOA region, semiconductor device) 23C for generating gain by current injection are integrated into one device. It is to be noted that, similarly as in the case of the phase controller integrated type SOA 10 described above, a separation section (separation region) 23D is formed between the electric field absorption type modulator section 23B and the SOA section 23C.

As shown in FIG. 9, the modulator integrated type DFB laser 23 includes an active waveguide (first optical waveguide, first single-mode waveguide, input waveguide, optical waveguide device) 1A for generating gain by current injection, an intensity modulation waveguide (second optical waveguide, second single-mode waveguide, output waveguide, optical waveguide device) 2B capable of changing the absorption coefficient by voltage application to modulate the intensity of light and a symmetric 1×1 MMI waveguide 3, and the optical waveguides 1A and 2B formed from materials or in structures different from each other are integrated into one device.

Further, the active waveguide 1A and the intensity modulation waveguide 2B are connected to each other through the symmetric 1×1 MMI waveguide 3. In other words, in the proximity of the connection interface 4 between the active waveguide 1A and the intensity modulation waveguide 2B, a symmetric 1×1 MMI structure is formed.

It is to be noted that the structures of the waveguides are same as those in the case of the phase controller integrated type SOA 10 described above.

Figure 10:
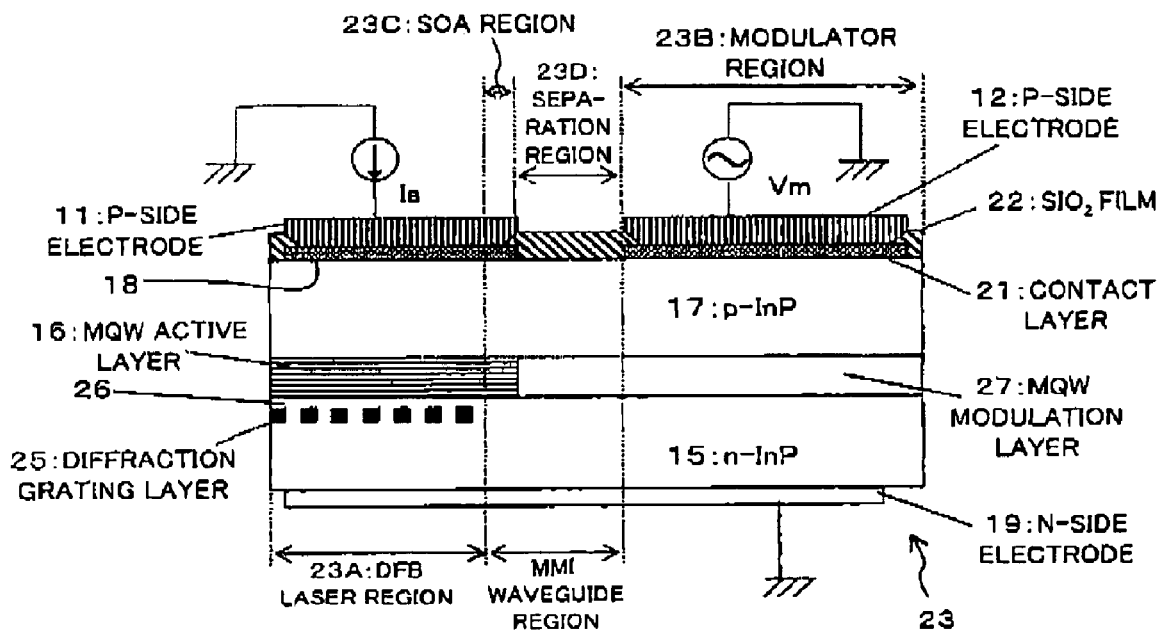
FIG. 10 is a schematic view showing a layer configuration of the modulator integrated type DFB laser as a different example of the semiconductor device according to the first embodiment of the present invention.

Further, as shown in FIG. 10, electrodes (here, P-side electrodes) 11 and 12 separated from each other are formed on element surfaces (device surfaces) above the regions including the waveguides 1A and 2B such that current Ia can be injected and a voltage Vm can be applied independently to the regions including waveguide 1A and 2B, respectively. In particular, as shown in FIG. 10, the active waveguide electrode 11 is formed on the device surface above the region including the active waveguide 1A, and the intensity modulation waveguide electrode 12 is formed on the device surface above the region including the intensity modulation waveguide 2B.

Further, as shown in FIG. 9, an anti-reflection film 24 is formed on the end face on the active waveguide 1A side, and another anti-reflection film 14 is formed on the end face on the intensity modulation waveguide 2B side. Next, a layer structure of the modulator integrated type DFB laser 23 configured in such a manner as described above is described with reference to FIG. 10 (schematic sectional view taken along a broken line denoted by b-b' in FIG. 9).

First, the active waveguide 1A (only a portion at which the width is reduced) which forms the DFB laser region 23A has a layer structure wherein, for example, an n-type InP buffer layer, an n-type InGaAsP diffraction grating layer, an n-type InP buffer layer, a 1.55 μm band strained MQW layer+SCH layer (InGaAsP layer), a p-type InP cladding layer, a p-type InGaAsP contact layer and a p-type InGaAs contact layer are stacked in order on an n-type InP substrate. In particular, as shown in FIG. 10, the active waveguide 1A which forms the DFB laser region 23A has a layer structure wherein an n-InP layer (n-type InP substrate, n-type InP buffer layer) 15, a diffraction grating layer 25, an n-InP layer 26, an MQW active layer (1.55 μm band strained MQW layer+SCH layer) 16, a p-InP layer (p-type InP cladding layer) 17 and a contact layer (p-type InGaAsP contact layer, p-type InGaAs contact layer) 18 are stacked in order.

Here, the diffraction grating layer 25 is formed by stacked a layer made of a material for forming the diffraction grating layer 25 on the n-InP layer 15 and periodically removing the layer using a method such as, for example, dry etching or the like and then growing the n-InP layer 26.

Then, as shown in FIG. 10, in order to inject the current Ia, the P-side electrode (active waveguide electrode) 11 and the N-side electrode (common electrode) 19 are formed on the top and bottom faces of the region of the active waveguide 1A having such a layer structure as described above, respectively.

Further, the active waveguide 1A (a portion of the MMI waveguide 3) which forms the SOA section 23C has a layer structure wherein, for example, an n-type InP buffer layer, a 1.55 μm band strained MQW layer+SCH layer (InGaAsP layer), a p-type InP cladding layer, a p-type InGaAsP contact layer and a p-type InGaAs contact layer are stacked in order on an n-type InP substrate. In particular, as shown in FIG. 10, the active waveguide 1A which forms the SOA section 23C has a layer structure wherein an n-InP layer (n-type InP substrate, n-type InP buffer layer) 15, an MQW active layer (1.55 μm band strained MQW layer+SCH layer) 16, a p-InP layer (p-type InP cladding layer) 17 and a contact layer (p-type InGaAsP contact layer, p-type InGaAs contact layer) 18 are stacked in order.

The active waveguide 1A which forms the SOA section 23C is formed by removing, after a layer made of a material for forming the diffraction grating layer 25 included in the active waveguide 1A which forms the DFB laser region 23A described above is stacked, a portion of the layer which is formed on the SOA region 23C and growing an n-type InP buffer layer again. It is to be noted here that, while an example is described wherein a layer formed from a material for forming the diffraction grating layer 25 is removed, the layer may be left on the entire surface of the SOA region 23C.

Then, as shown in FIG. 10, in order to inject the current Ia, a P-side electrode (active waveguide electrode) 11 and an N-side electrode (common electrode) 19 are formed on the top and bottom faces of the region of the active waveguide 1A having such a layer configuration as described above, respectively.

In this manner, the active waveguide 1A which forms part of the MMI waveguide 3 functions as an SOA for amplifying emitting light from the DFB laser section 23A.

Further, the intensity modulation waveguide 2B has a layer structure wherein, for example, an n-type InP buffer layer, a 1.45 μm band MQW waveguide layer (InGaAsP layer), a p-type InP cladding layer, a p-type InGaAsP contact layer and a p-type InGaAs contact layer are stacked in order on an n-type InP substrate. In particular, as shown in FIG. 10, the intensity modulation waveguide 2B has a layer structure wherein an n-InP layer (n-type InP substrate, n-type InP buffer layer) 15, an MQW modulation layer (1.45 μm band MQW waveguide layer) 27, a p-InP layer (p-type InP cladding layer) 17 and a contact layer (p-type InGaAsP contact layer, p-type InGaAs contact layer) 21 are stacked in order.

The intensity modulation waveguide 2B is formed by removing, after a layer made of a material for forming the diffraction grating layer 25 included in the active waveguide 1A which forms the DFB laser region 23A described hereinabove is stacked, a portion of the layer which formed in the modulator region 23B and growing an n-type InP buffer layer again. It is to be noted here that, while an example is described wherein a layer formed from a material for forming the diffraction grating layer 25 is removed, the layer may be left on the entire surface of the modulator region 23B.

In this manner, in the present modulator integrated type DFB laser 23, the DFB laser region 23A and the SOA region 23C include the active waveguide 1A provided with the MQW active layer 16 formed from the 1.55 μm band strained MQW layer+SCH layer while the modulator region 23B includes the intensity modulation waveguide 2B provided with the MQW modulation layer 27 formed from the 1.45 μm band MQW waveguide layer, and the modulator integrated type DFB laser 23 has a structure wherein optical waveguides formed from materials (compositions) and in structures different from each other are connected to each other.

Then, as shown in FIG. 10, in order to apply the voltage Vm, a P-side electrode (intensity modulation waveguide electrode) 12 and an N-side electrode (common electrode) 19 are formed on the top and bottom faces of the region of the intensity modulation waveguide 2B having such a layer structure as described above.

It is to be noted that, as a current constriction structure for the MQW active layer 16 and the MQW modulation layer 27, for example, a SI-BH structure (Semi-insulating Buried Heterostructure) may be used.

Incidentally, similarly as in the phase controller integrated type SOA 10 described above, in order to electrically separate the SOA section (SOA region) 23C and the modulator section (modulator region) 23B from each other, a separation region (separation section) 23D is provided as shown in FIGS. 9 and 10. In particular, by forming the intensity modulation waveguide electrode (P-side electrode) 12 and the contact layer 21 but not in a region above the region (intensity modulation waveguide structure region) formed from a material and in a structure same as those of the intensity modulation waveguide from within the MMI waveguide region including the connection interface 4 between the active waveguide 1A and the intensity modulation waveguide 2B, the separation region (separation section) 23D is formed between the SOA section (SOA region) 23C and the modulator section (modulator region) 23B. Therefore, the contact layer 21 and the intensity modulation waveguide electrode (P-side electrode) 12 are formed only in the region just above the intensity modulation waveguide 2B.

Since the phase controlling waveguide structure region of the MMI waveguide region includes the MQW modulation layer 27 formed from the 1.45 μm band MQW waveguide layer as described above, light absorption of a 1.45 μm band when a voltage is not applied is basically low. Therefore, even if current is not injected, there is no problem. Such a waveguide as just described is called passive waveguide. Therefore, no electrode is provided in the phase controlling waveguide structure region of the MMI waveguide region such that this portion functions as the separation region (separation section) 23D for performing electrical separation between devices. In this manner, by causing the phase controlling waveguide structure region of the MMI waveguide region to function as an electrical device separation region necessary for a case wherein a plurality of devices are integrated, increase of the entire device length by insertion of the MMI waveguide 3 can be suppressed to the minimum.

It is to be noted that, similarly as in the phase controller integrated type SOA 10 described hereinabove, a $SiO_2$ film (passivation film) 22 is formed in the region in which the contact layers 18 and 21, intensity modulation waveguide (P-side electrode) 12 and active waveguide electrode (P-side electrode) 11 are not formed as shown in FIG. 10.

Accordingly, with the modulator integrated type DFB laser 23 according to the present embodiment, since the reflection on the connection interface 4 between the active waveguide 1A which forms the DFB laser section 23A and the SOA section 23C and the intensity modulation waveguide 2B which forms the modulator section 23B can be suppressed, instability of laser oscillation by reflected returning light to the DFB laser section 23A can be suppressed. As a result, stabilized laser oscillation operation can be implemented.

It is to be noted here that, while the semiconductor device configured from InP type materials is described as a particular example of the semiconductor device to which the present invention is applied, the materials are not limited to those described above. Further, while the optical waveguide device here is described wherein a phase controller, an SOA or a DFB laser and an intensity modulator are integrated into one device, the present invention is not limited to this, but the present invention can be applied widely to an optical waveguide device and the effect of reflection suppression can be obtained if the optical waveguide device has a portion for connecting waveguides different in kind from each other is used in order to integrate a plurality (two kinds or more) of devices formed from optical waveguides of materials or structures different from each other. For example, the present invention can be applied also to an optical waveguide device wherein a semiconductor laser such as a DBR (Distributed Bragg Reflector; distributed Bragg refection type) laser, a Fabry-Perot laser or the like and an intensity modulator are integrated. Further, the present invention can be applied also to a connection interface between a DBR layer and an active layer of a DBR laser.

Second Embodiment

Next, an optical waveguide device (optical waveguide element) and a semiconductor device (semiconductor element) according to a second embodiment of the present invention are described with reference to FIGS. 11 to 14.

In the optical waveguide device according to the present embodiment, the positions of the input and output waveguides (that is, positions of the input and output ports) are different from those in the first embodiment described above. In particular, while, in the first embodiment described above, the 1×1 multi-mode interference (MMI) waveguide is configured as a symmetric 1×1 MMI waveguide, in the present embodiment, the 1×1 MMI waveguide is configured as an asymmetric 1×1 MMI waveguide 31 as shown in FIG. 11.

It is to be noted that the configuration of the other part is same as that in the first embodiment described above. Further, like elements to those in FIG. 11 are denoted by like reference characters to those in the first embodiment (refer to FIG. 1) described above.

Figure 11:
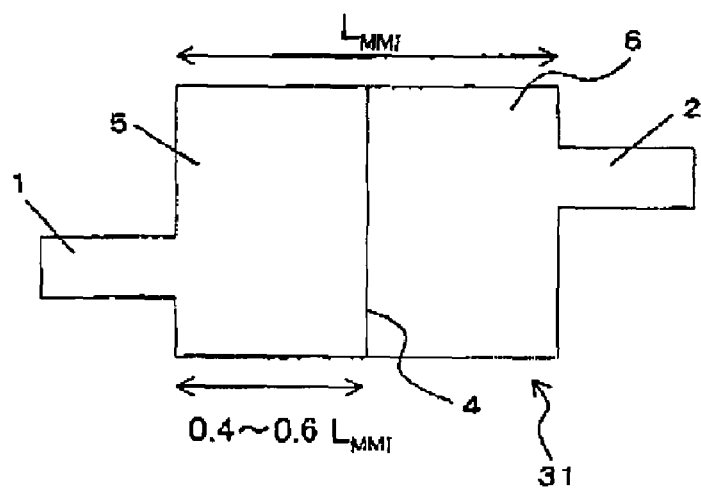
FIG. 11 is a schematic view showing a configuration of an asymmetric 1×1 MMI waveguide included in an optical waveguide device according to a second embodiment of the present invention.

As shown in FIG. 11, in the present embodiment, the 1×1 MMI waveguide 31 is configured as an asymmetric 1×1 MMI waveguide wherein an optical waveguide (input waveguide) 1 on the input side and an optical waveguide (output waveguide) 2 on the output side are connected individually to positions displaced from the central position in the widthwise direction (in particular, input and output ports are provided individually at positions displaced from the central position in the widthwise direction). In other words, in the asymmetric 1×1 MMI waveguide 31, the input waveguide 1 and the output waveguide 2 are connected individually to symmetric positions with respect to the central position in the widthwise direction. In the MMI waveguide 31, if the input waveguide 1 is connected to the position displaced from the central position in the widthwise direction, then image formation on the output side is performed at the symmetric position with respect to the central position in the widthwise direction. Therefore, in the asymmetric 1×1 MMI waveguide 31, the output waveguide 2 is connected to the symmetric position across the central position in the widthwise direction of the MMI waveguide 31 with respect to the input waveguide 1.

Then, as shown in FIG. 11, in the present embodiment, the connection interface 4 between two kinds of single-mode waveguides 1 and 2 is provided at the position of 0.4 to 0.6 (0.4 to 0.6 $L_{MMI}$) times the length $L_{MMI}$ of the asymmetric 1×1 MMI waveguide 31 from the input side.

In this manner, in the present embodiment, by providing the connection interface 4 between the two kinds of the single-mode waveguides 1 and 2 at the position of 0.4 to 0.6 times (preferably, 0.5 times) the length $L_{MMI}$ of the asymmetric 1×1 MMI waveguide 31 from the input side, the influence of reflected light on the connection interface 4 is suppressed utilizing a phenomenon of self-imaging of the MMI waveguide.

In such an asymmetric 1×1 MMI waveguide 31 as described above, since image formation on the output side is performed at the symmetric position with respect to the central position in the widthwise direction, the light intensity decreases at the position at which the input waveguide 1 is connected. Therefore, if the connection interface 4 is provided at the position of 0.5 times ($L_{MMI}/2$) the length $L_{MMI}$ of the asymmetric 1×1 MMI waveguide 31, then the reflected light to be coupled to the input waveguide 1 can be reduced (light intensity of the reflected light can be reduced) and the influence of the reflected light can be suppressed.

Figure 12:
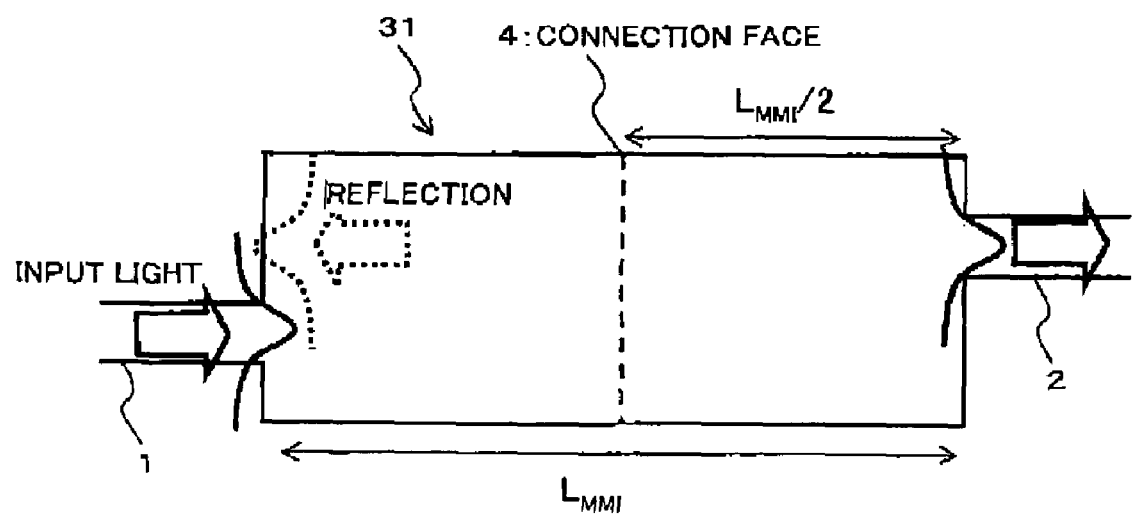
FIG. 12 is a schematic view illustrating the reflection suppression principle by the asymmetric 1×1 MMI waveguide included in the optical waveguide device according to the second embodiment of the present invention.

In particular, in the asymmetric 1×1 MMI waveguide 31, if the connection interface 4 is provided at the position of 0.5 times ($L_{MMI}/2$) the length $L_{MMI}$ of the MMI waveguide 31 as indicated by a broken line in FIG. 12, then light reflected on the connection interface 4 propagates by the length $L_{MMI}$ of the MMI waveguide 31 before the reflected light returns to the input port (input section) of the MMI waveguide 31.

In this instance, as indicated by a dotted line in FIG. 12, the light intensity distribution of the light reflected on the connection interface 4 on the input port of the asymmetric 1×1 MMI waveguide 31 is equal to that of output light to be coupled to the output waveguide 2, and the light intensity at the position to which the input waveguide 1 is connected decreases.

Accordingly, in the asymmetric 1×1 MMI waveguide 31, if the connection interface 4 is provided at the position of 0.5 times ($L_{MMI}/2$) the length $L_{MMI}$ of the asymmetric 1×1 MMI waveguide 31, then the reflected light to be coupled to the input waveguide 1 can be reduced (light intensity of the reflected light can be reduced) and the influence of the reflected light can be suppressed.

Figure 13:
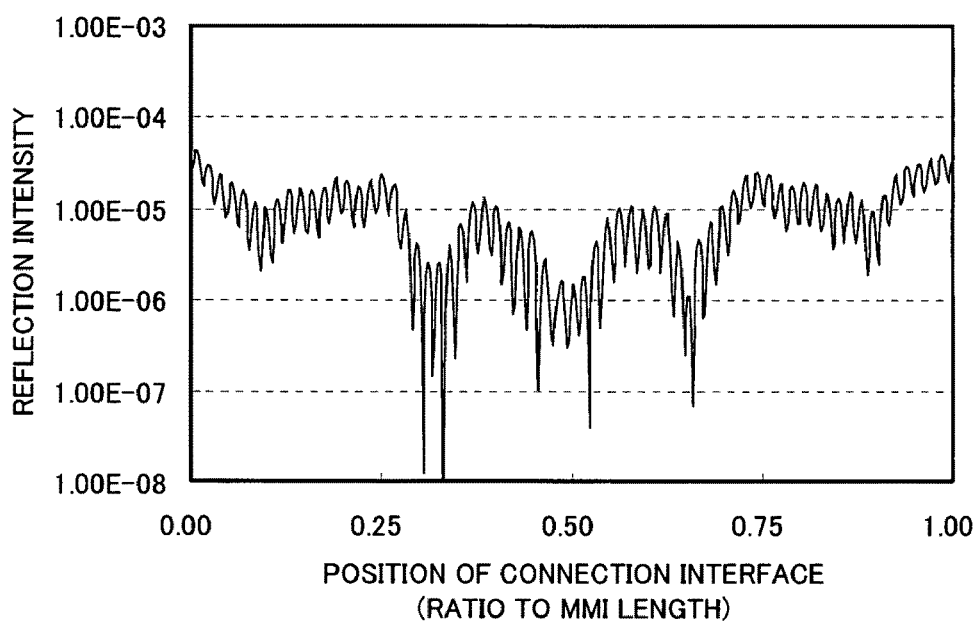
FIG. 13 is a view showing a relationship between the position of the connection interface and the reflection intensity in the asymmetric 1×1 MMI waveguide included in the optical waveguide device according to the second embodiment of the present invention.

Here, FIG. 13 is a view showing a result of calculation of the light intensity (reflection intensity) of the reflected light returning to the input waveguide 1 where the position (ratio with respect to the MMI length) of the connection interface 4 is changed continuously in the asymmetric 1×1 MMI waveguide 31. It is to be noted that, in this calculation, a case is assumed wherein reflection of approximately $6\times10^{-5}$ occurs on the connection interface 40.

As apparent from a result of the calculation in FIG. 13, in the asymmetric 1×1 MMI waveguide 31, the reflection intensity is suppressed where the connection interface 4 is provided at the position of approximately 0.5 times ($L_{MMI}/2$) the length (MMI length) $L_{MMI}$ of the asymmetric 1×1 MMI waveguide 31, and it is recognized that, if the connection interface 4 is provided at the position of 0.4 to 0.6 times (0.4 to 0.6 $L_{MMI}$) the length (MMI length) $L_{MMI}$ of the asymmetric 1×1 MMI waveguide 31, then the reflection intensity can be suppressed to the order of approximately $10^{-6}$.

Therefore, in the present embodiment, the connection interface 4 between the two kinds of the single-mode waveguides 1 and 2 is provided at the position of 0.4 to 0.6 times (0.4 to 0.6 $L_{MMI}$) the length $L_{MMI}$ of the asymmetric 1×1 multi-mode interference waveguide 31 from the input side as described above.

Accordingly, with the present embodiment, there is an advantage that, only if the position of the connection interface 4 is adjusted where an optical waveguide device is produced wherein waveguides different in kind from each other are integrated on the same substrate, the influence of the reflected light on the connection interface 4 can be suppressed easily and with certainty while characteristics of the optical waveguides are compensated for. As a result, in the optical waveguide device wherein waveguides different in kind from each other are integrated on the same substrate, stabilized operation can be implemented.

Figure 14:
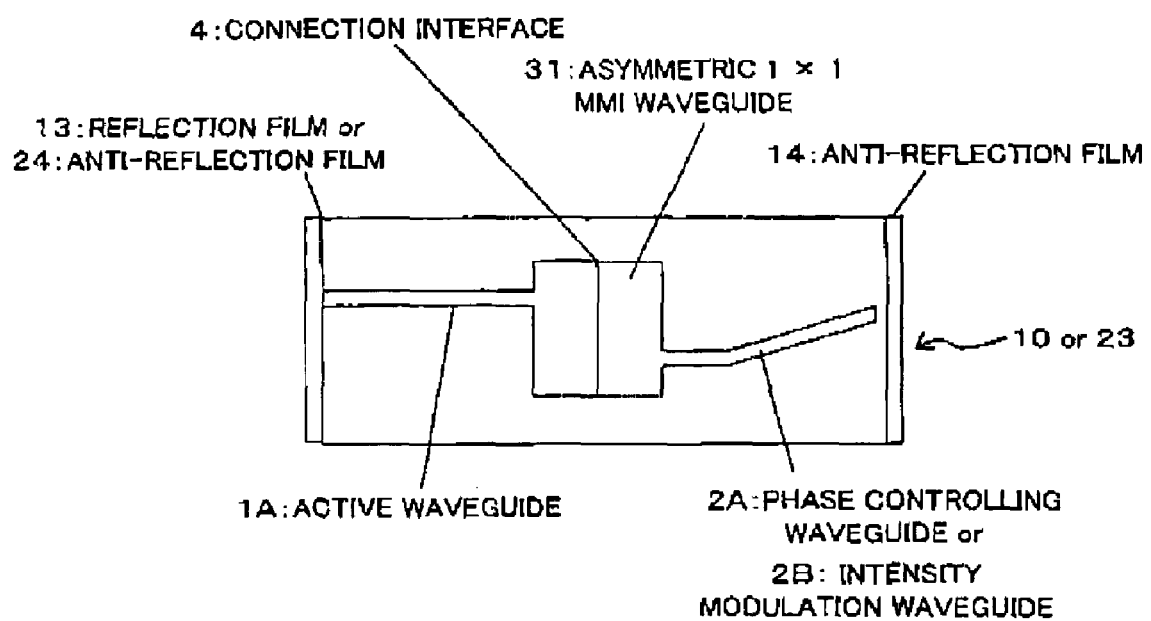
FIG. 14 is a schematic view showing a configuration of a phase controller integrated type SOA or a modulator integrated type DFB laser as an example of the semiconductor device according to the second embodiment of the present invention.

It is to be noted that the optical waveguide device configured in such a manner as described above can be applied to a phase controller integrated type SOA or the present modulator integrated type DFB laser similarly to the optical waveguide device of the first embodiment described above. In this instance, the optical waveguide device may be configured such that, as shown in FIG. 14, the asymmetric 1×1 MMI waveguide 31 configured in such a manner as described above is provided in place of the symmetric 1×1 MMI waveguide 3 included in the phase controller integrated type SOA of the first embodiment described hereinabove or the present modulator integrated type DFB laser. It is to be noted that, since the configuration of the other part is same as that of the phase controller integrated type SOA of the first embodiment described above or the present modulator integrated type DFB laser, description of the configuration is omitted here.

Here, the size of the asymmetric 1×1 MMI waveguide 31 may be set such that, for example, the width is approximately 8 μm and the length is approximately 230 μm. Further, the center of the active waveguide as the input waveguide may be displaced by approximately 1.5 μm from the central position in the widthwise direction of the MMI waveguide 31, and the center of the phase controlling waveguide or the intensity modulation waveguide as the output waveguide may be displaced by approximately 1.5 μm in the direction opposite to that of the center of the active waveguide with respect to the central position in the widthwise direction of the MMI waveguide 31.

Third Embodiment

Next, an optical waveguide device (optical waveguide element) and a semiconductor device (semiconductor element) according to the third embodiment of the present invention are described with reference to FIG. 15 (a) to FIG. 19.

Figure 15A:
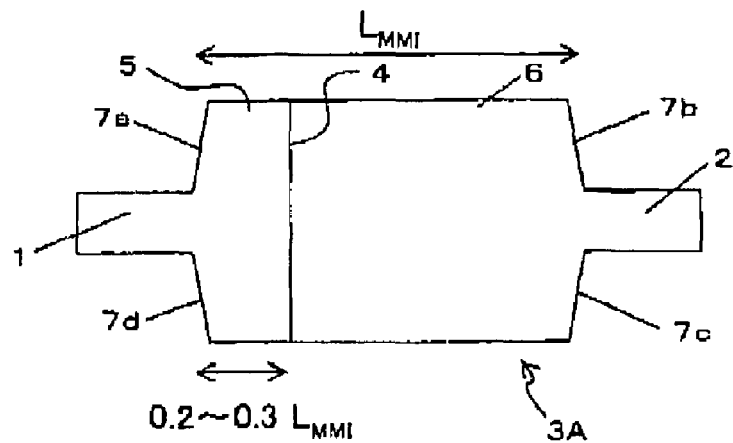
FIGS. 15 (a), (b) are schematic views showing a configuration of MMI waveguides included in an optical waveguide device according to a third embodiment of the present invention and show a configuration of symmetric 1×1 MMI waveguides, and FIG. 15 (c) is a schematic view showing a different configuration of an MMI waveguide included in the optical waveguide device according to the third embodiment of the present invention and shows a configuration of an asymmetric 1×1 MMI waveguide.
Figure 15B:
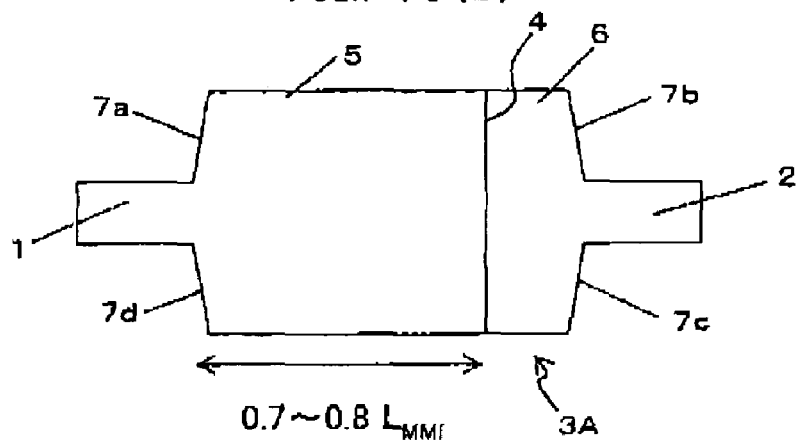
Figure 15C:
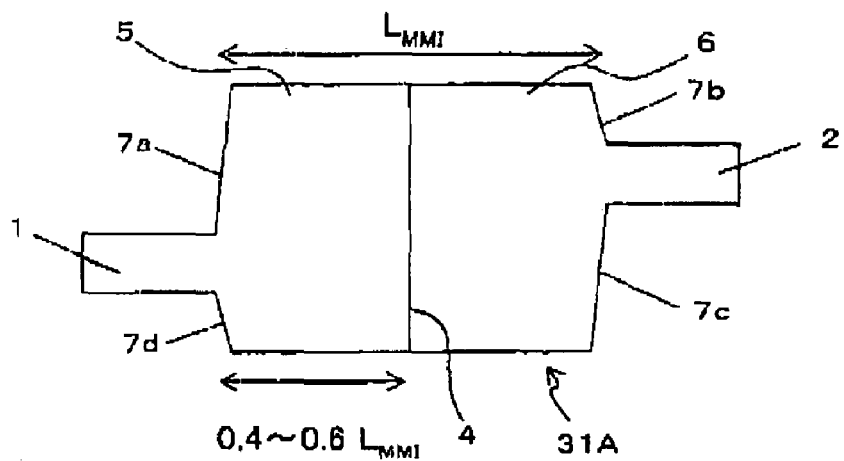

In the optical waveguide device according to the present embodiment, the angles of end faces on the input and output sides of a 1×1 multi-mode interference (MMI) waveguide are different from those of the first and second embodiments described above. In particular, while, in the first and second embodiments described above, the 1×1 MMI waveguide has a rectangular shape as viewed in plan and the end faces on the input and output sides extend perpendicularly to the longitudinal direction (waveguide direction, optical axial direction, optical waveguide direction) of the 1×1 MMI waveguide, in the present embodiment, as shown in FIG. 15(a) to FIG. 15(c), end faces 7a to 7d on the input and output sides of 1×1 MMI waveguides 3A and 31A extend obliquely.

It is to be noted that the configuration of the other part is same as that of the first and second embodiments described hereinabove. Further, like elements to those in FIG. 15(a) to FIG. 15 (c) are denoted by like reference characters to those in the first embodiment (refer to FIG. 1) and second embodiment (refer to FIG. 11) described hereinabove.

In the present embodiment, the end faces 7a to 7d on the input and output sides of the 1×1 MMI waveguides 3A and 31A are configured so as to have an inclination angle within a predetermined angular range with respect to the faces (end faces on the input and output sides in the first and second embodiments) perpendicular to the waveguide longitudinal direction. Therefore, the end faces 7a to 7d are formed obliquely. It is to be noted that, only if a pattern of a $SiO_2$ mask to be used upon dry etching is set obliquely, then working for forming the end faces 7a to 7d obliquely can be implemented easily.

The reason why the end faces 7a to 7d on the input and output sides of the 1×1 MMI waveguides 3A and 31A are formed obliquely in this manner is described below.

In particular, if the end faces on the input and output sides of the 1×1 MMI waveguides 3A and 31A are formed perpendicularly to the waveguide longitudinal direction similarly as in the first and second embodiments described above, then as apparently seen from the results of the calculation of FIGS. 4, 5 and 13, the reflection intensity when the position of the connection interface 4 is changed oscillates finely. It is considered that the fine oscillation just described is caused by the interference (for example, interference by reflection on the end face on the input side or the end face on the output side of the 1×1 MMI waveguides 3 and 31) in the inside of the 1×1 MMI waveguides 3 and 31.

Therefore, in the present embodiment, in order to suppress fine oscillation of the reflection intensity, the end faces 7a to 7d on the input and output sides of the 1×1 MMI waveguides 3A and 31A are formed obliquely.

Figure 16:
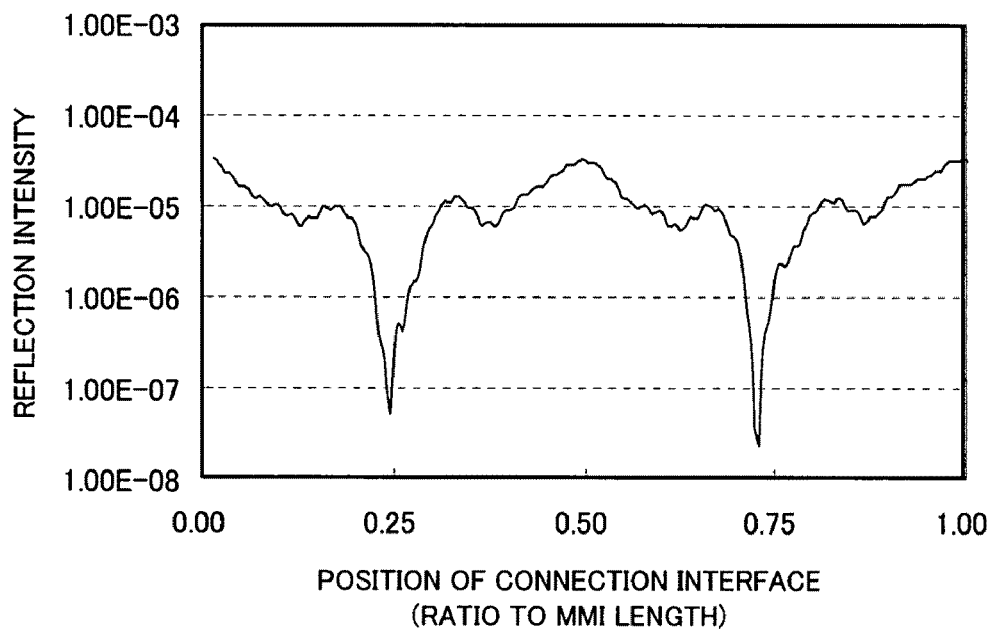
FIG. 16 is a view showing a relationship between the position of the connection interface and the reflection intensity in the symmetric 1×1 MMI waveguide included in the optical waveguide device according to the third embodiment of the present invention.
Figure 17:
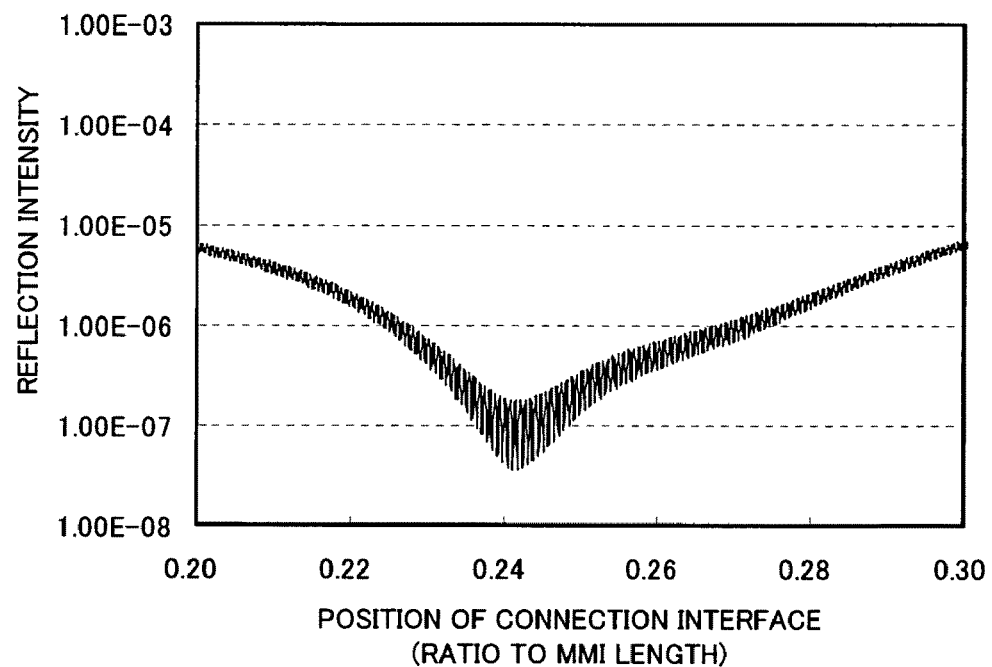
FIG. 17 is a view showing a relationship between the position of the connection interface and the reflection intensity in the symmetric 1×1 MMI waveguide included in the optical waveguide device according to the third embodiment of the present invention.

Here, FIG. 16 is a view showing a result of calculation of the light intensity (reflection intensity) of reflected light returning to the input waveguide 1 when the position (ratio with respect to the MMI length) of the connection interface 4 is successively changed in the symmetric 1×1 MMI waveguide 3A wherein the end faces 7a to 7d are formed obliquely. Meanwhile, FIG. 17 is a view showing in an enlarged scale the position particularly at which the reflection is suppressed from within the result of the calculation of FIG. 16. It is to be noted that, in this calculation, it is assumed that reflection of approximately $6\times10^{-5}$ occurs on the connection interface 4.

As apparent from comparison between the result of the calculation in FIGS. 16 and 17 and the result of the calculation in FIGS. 4 and 5, it is recognized that, by forming the end faces 7a to 7d on the input and output sides of the 1×1 MMI waveguide 3A obliquely, the interference in the inside of the 1×1 MMI waveguide 3A is suppressed and fine oscillation of the reflection intensity is suppressed.

Here, it is preferable to set the inclination angle, for example, within a range of 10 degrees to 80 degrees. The lower limit is defined as an angle necessary to suppress the resonance effect in the inside of the 1×1 MMI waveguides 3A and 31A. Therefore, the angle of the end faces 7a to 7d is set to 10 degrees or more so that the resonance effect can be suppressed sufficiently. On the other hand, the upper limit is defined as an angle necessary to allow the 1×1 MMI waveguides 3A and 31A to function as an MMI waveguide (for reproducing the light intensity distribution in the input waveguide 1 in the output waveguide 2). Therefore, the angle of the end faces 7a to 7d is set to 80 degrees or less in order to prevent the light intensity of output light to be inputted to the output waveguide 2 from decreasing to a low level thereby to prevent the loss of a device (element) from increasing.

Accordingly, with the present embodiment, there is an advantage that, where an optical waveguide device wherein waveguides different in kind from each other are integrated on the same substrate is to be fabricated, only if the position of the connection interface 4 is adjusted, then the influence of reflected light on the connection interface 4 can be suppressed easily and with certainty while the characteristics of the optical waveguide are compensated for. As a result, in the optical waveguide device wherein waveguides different in kind from each other are integrated on the same substrate, stabilized operation can be implemented.

Particularly, in the present embodiment, since the end faces 7a to 7d on the input and output sides of the 1×1 MMI waveguide 3A are formed obliquely, the interference in the inside of the 1×1 MMI waveguide 3A can be suppressed and fine oscillation of the reflection intensity can be suppressed. As a result, the influence of the reflected light on the connection interface 4 can be suppressed more effectively and the reflection intensity can be decreased with certainty to the order of $10^{-6}$.

Further, by forming the end faces 7a to 7d on the input and output sides of the 1×1 MMI waveguides 3A and 31A obliquely to suppress fine oscillation of the reflection intensity, even if the position of the connection interface 4 is displaced a little, a desired reflection intensity (or reflection intensity nearer to the desired reflection intensity) can be obtained.

In particular, in the first embodiment described above, as apparent from the result of the calculation of FIG. 5, for example, where the position of the connection interface 4 is set to that of 0.26 times the length $L_{MMI}$ of the MMI waveguide 3 to suppress the reflection intensity to the order of $10^{-8}$, if the position of the connection interface 4 is displaced a little, then the reflection intensity can be suppressed only to the order of $10^{-6}$ and the desired reflection intensity (the order of $10^{-8}$) cannot be obtained. On the other hand, according to the present embodiment, as apparent from the result of the calculation of FIG. 17, for example, where the position of the connection interface 4 is set to that of 0.26 times the length $L_{MMI}$ of the MMI waveguide 3 to suppress the reflection intensity to the order of $10^{-7}$, even if the position of the connection interface 4 is displaced a little, the reflection intensity can be suppressed to the order of $10^{-7}$ and the desired reflection intensity (the order of $10^{-7}$) can be obtained.

In this manner, the design for suppressing fine oscillation of the reflection intensity to obtain a desired reflection intensity (or reflection intensity near to the desired reflection intensity) is important particularly where it is difficult to adjust the position of the connection interface 4 accurately.

It is to be noted that, in the embodiment described above, while all of the end faces 7a to 7d on the input and output sides of the 1×1 MMI waveguides 3A and 31A are formed obliquely, the present invention is not limited to this. For example, only one of the end faces opposed to each other may be formed obliquely. In particular, only one of the end face 7a on the input side and the end face 7b on the output side may be formed obliquely, or only one of the end face 7d on the input side and the end face 7c on the output side may be formed obliquely. Further, only if one of the four end faces 7a to 7d is formed obliquely, when compared with that in a case wherein none of the end faces is formed obliquely, the effect can be obtained that fine oscillation of the reflection intensity is suppressed.

Further, similarly to the optical waveguide device of the first embodiment described above, the optical waveguide device configured in such a manner as described above can be applied to a phase controller integrated type SOA and a modulator integrated type DFB laser.

Figure 18:
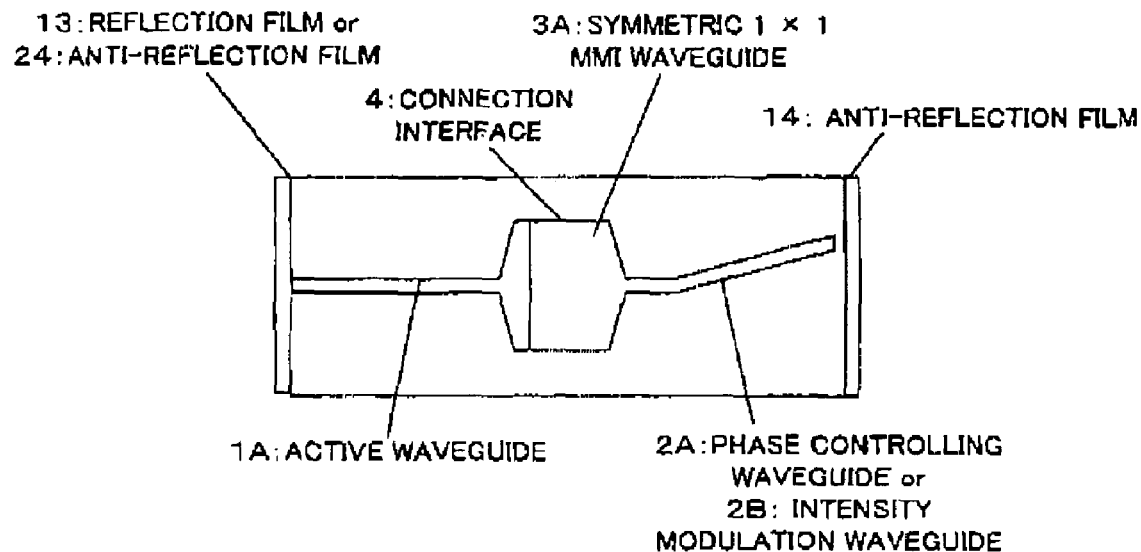
FIG. 18 is a schematic view showing a configuration of a phase controller integrated type SOA or a modulator integrated type DFB laser as an example of the semiconductor device according to the third embodiment of the present invention.

In this instance, the optical waveguide device may be configured so as to include the symmetric 1×1 MMI waveguide 3A configured in such a manner as described above in place of the symmetric 1×1 MMI waveguide 3 included in the phase controller integrated type SOA of the first embodiment described herein above and the present modulator integrated type DFB laser as shown in FIG. 18.

Figure 19:
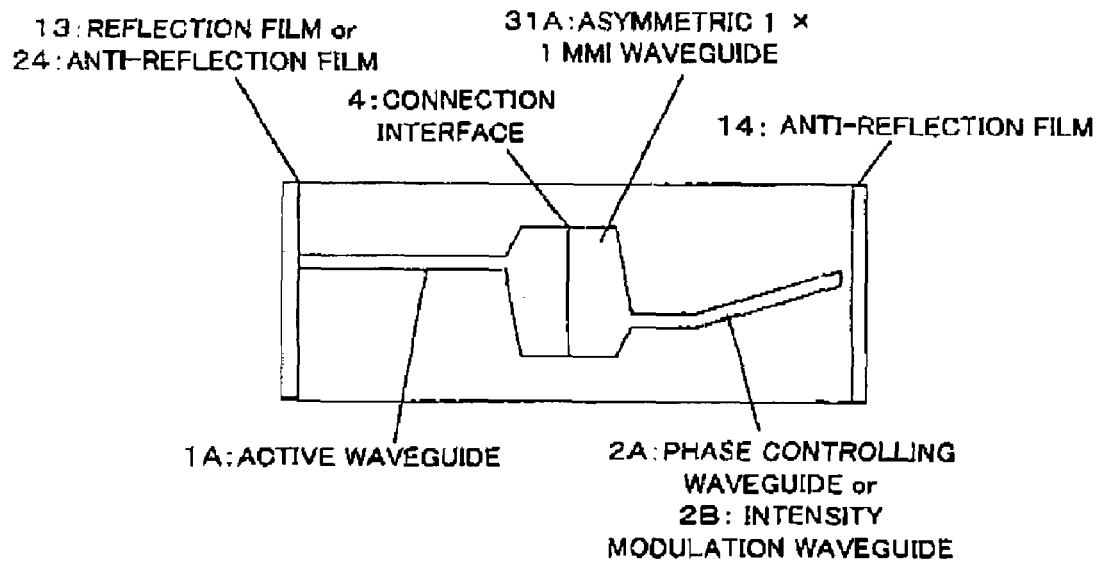
FIG. 19 is a schematic view showing a configuration of a phase controller integrated type SOA or a modulator integrated type DFB laser as a different example of the semiconductor device according to the third embodiment of the present invention.
Figure 20:
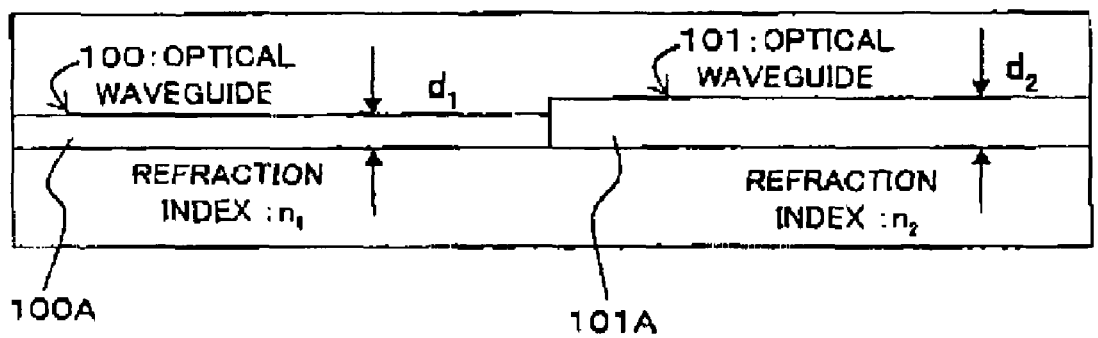
FIG. 20 is a schematic sectional view illustrating an example of a configuration of a conventional optical waveguide device wherein a plurality of devices are integrated.
Figure 21:
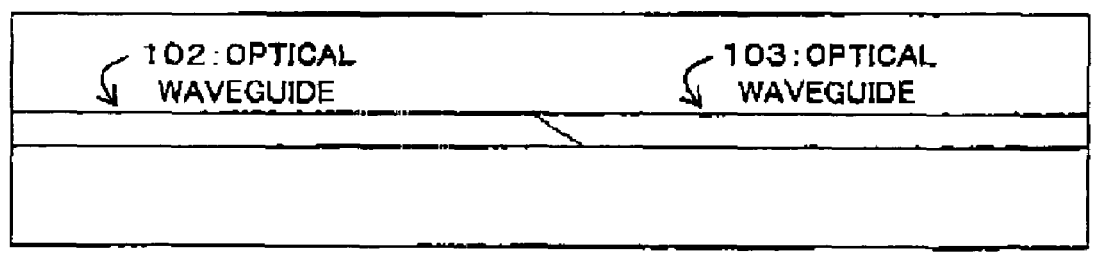
FIG. 21 is a schematic plan view illustrating a different example of a configuration of a conventional optical waveguide device wherein a plurality of devices are integrated.
Figure 22A:
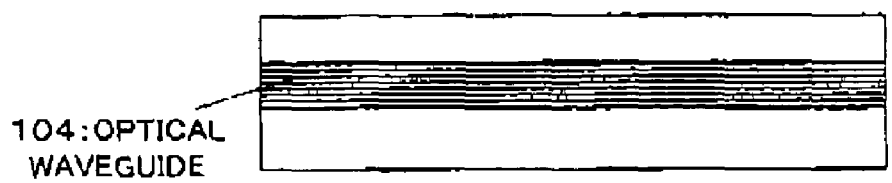
FIG. 22 (a) to FIG. 22 (d) are schematic sectional views illustrating a fabrication method (butt joint coupling) of a common optical waveguide device wherein a plurality of devices are integrated.
Figure 22B:
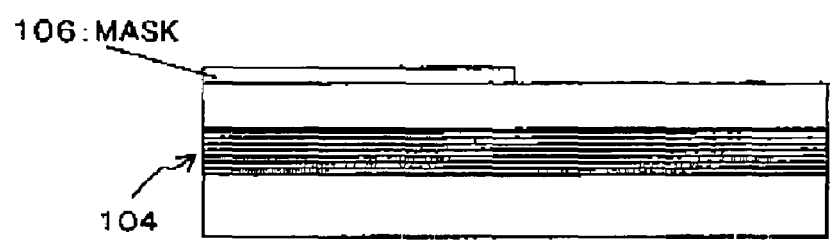
Figure 22C:
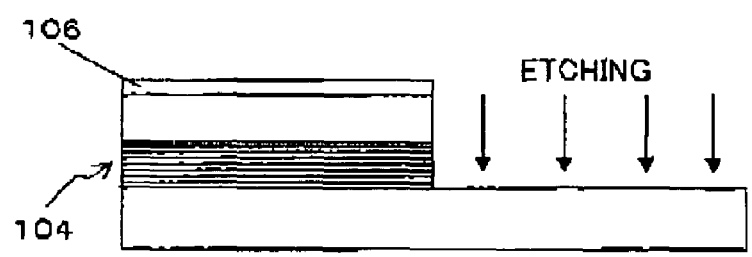
Figure 22D:
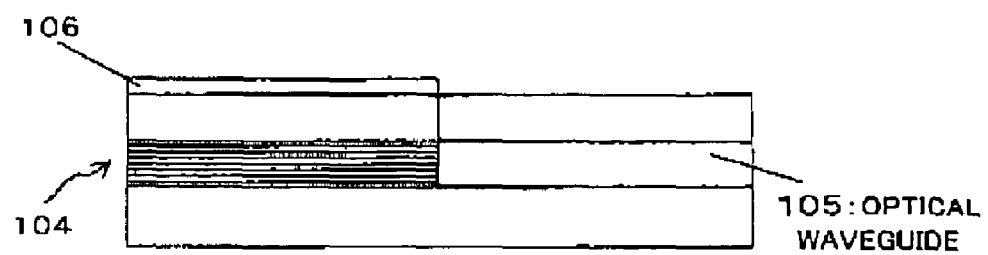

Further, the optical waveguide device may be configured so as to include the asymmetric 1×1 MMI waveguide 31A configured in such a manner as described above in place of the asymmetric 1×1 MMI waveguide 31 included in the phase controller integrated type SOA of the second embodiment described above and the present modulator integrated type DFB laser as shown in FIG. 19.

It is to be noted that, since the configuration of the other part is same as that of the phase controller integrated type SOA of the first embodiment described above and the present modulator integrated type DFB laser, description of the configuration is omitted here.

The invention claimed is:
1. An optical waveguide divice, comprising:
a first optical waveguide;
a second optical waveguide formed from a material or in a structure different from that of said first optical waveguide and connected to said first optical waveguide; and
a 1×1 multimode interference waveguide formed by increasing the widths of said first and second optical waveguides in proximity of a connection interface between said first and second optical waveguides;
wherein said first optical waveguide is an active waveguide wherein absorption is high when current is not injected but gain can be generated when current is injected; and
said second optical waveguide is a passive waveguide wherein absorption is low when no voltage is applied or no current is injected;
said optical waveguide device further comprising:
an active waveguide electrode for injecting current to said active waveguide; and
a passive waveguide electrode for performing current injection or voltage application to said passive waveguide;
said active waveguide electrode being formed also above said 1×1 multimode interference waveguide while said passive waveguide electrode is not formed above said 1×1 multimode interference waveguide.

2. An optical waveguide device, comprising:
a first optical waveguide;
a second optical waveguide formed from a material or in a structure different from that of said first optical waveguide and connected to said first optical waveguide; and
a 1×1 multimode interference waveguide provided between said first and second optical waveguides and including a first portion formed from a material or in a structure same as that of said first optical waveguide and a second portion formed from a material or in a structure same as that of said second optical waveguide;
wherein a position of a connection interface between said first portion and said second portion is set such that light reflected on the connection interface forms an image at a region other than said first optical waveguide or said second optical waveguide.

3. An optical waveguide device as claimed in claim 2, wherein said 1×1 multimode interference waveguide is a symmetric 1×1 multimode interference waveguide having an input port and an output port at the central position in the widthwise direction; and the connection interface is positioned at a distance 0.2 to 0.3 times or 0.7 to 0.8 times the length of the symmetric 1×1 multimode interference waveguide from the input side.

4. An optical waveguide device as claimed in claim 2, wherein the connection interface extends perpendicularly to the waveguide direction.

5. An optical waveguide device as claimed in claim 2, wherein said 1×1 multimode interference waveguide is an asymmetric 1×1 multimode interference waveguide having an input port and an output port at positions displaced from the central position in the widthwise direction; and the connection interface is positioned at a distance 0.4 to 0.6 times the length of the asymmetric 1×1 multimode interference waveguide from the input side.

6. An optical waveguide device as claimed in claim 2, wherein said 1×1 multimode interference waveguide is configured such that an end face on the input end or the output end thereof extends obliquely.

7. An optical waveguide device as claimed in claim 6, wherein the end face on the input end or the output end of said 1×1 multimode interference waveguide is configured so as to have an inclination angle within a range of 10 to 80 degrees with respect to a perpendicular face to the longitudinal direction of said 1×1 multimode interference waveguide.

8. An optical waveguide device as claimed in claim 2, wherein said first optical waveguide is an active waveguide capable of generating gain by current injection, and said second optical waveguide is a phase controlling waveguide capable of varying the refraction index by current injection, voltage application or temperature adjustment to control the phase.

9. An optical waveguide device as claimed in claim 2, wherein said first optical waveguide is an active waveguide capable of generating gain by current injection, and said second optical waveguide is an intensity modulation waveguide capable of varying the absorption coefficient by voltage application to modulate the intensity of light.

10. An optical waveguide device comprising:
a first optical waveguide;
a second optical waveguide formed from a material or in a structure different from that of said first optical waveguide and connected to said first optical waveguide; and
a 1×1 multimode interference waveguide formed by increasing the widths of said first and second optical waveguides in the proximity of a connection interface between said first and second optical waveguides;
wherein said first optical waveguide is an active waveguide;
said second optical waveguide is a phase controlling waveguide;
an active waveguide electrode is provided above said active waveguide; and
a phase controlling waveguide electrode is provided above a narrow portion of said phase controlling waveguide;
the semiconductor optical amplifier including said active waveguide and said active waveguide electrode and the phase controller including the narrow portion of said phase controlling waveguide and said phase controlling waveguide electrode are integrated.

11. The optical waveguide device as claimed in claim 10, wherein a broad portion of the phase controlling waveguide functions as a separation region for electrically separating the semiconductor optical amplifier and the phase controller from each other.

12. An optical waveguide device comprising:
a first optical waveguide;
a second optical waveguide formed from a material or in a structure different from that of said first optical waveguide and connected to said first optical waveguide; and
a 1×1 multimode interference waveguide formed by increasing the widths of said first and second optical waveguides in the proximity of a connection interface between said first and second optical waveguides;
wherein said first optical waveguide is an active waveguide;
said second optical waveguide is an intensity modulation waveguide;
an active waveguide electrode is provided above said active waveguide; and
an intensity modulation waveguide electrode is provided above a narrow portion of said intensity modulation waveguide;
the DFB laser including a narrow portion of said active waveguide and said active waveguide electrode;
the semiconductor optical amplifier including a broad portion of the active waveguide and said active waveguide electrode and the intensity modulator including a narrow portion of said intensity modulation waveguide and said intensity modulation waveguide electrode are integrated.

13. The optical waveguide device as claimed in claim 12, wherein a broad portion of the intensity modulation waveguide functions as a separation region for electrically separating the semiconductor optical amplifier and the intensity modulator from each other.

* * * * *